(12) United States Patent
Jelinek et al.

(10) Patent No.: US 11,908,694 B2
(45) Date of Patent: Feb. 20, 2024

(54) ION BEAM IMPLANTATION METHOD AND SEMICONDUCTOR DEVICE

(71) Applicant: Infineon Technologies AG, Neubiberg (DE)

(72) Inventors: Moriz Jelinek, Villach (AT); Michael Hell, Erlangen (DE); Caspar Leendertz, Munich (DE); Kristijan Luka Mletschnig, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 387 days.

(21) Appl. No.: 17/127,309

(22) Filed: Dec. 18, 2020

(65) Prior Publication Data

US 2021/0193435 A1   Jun. 24, 2021

(30) Foreign Application Priority Data

Dec. 20, 2019   (DE) .............................. 102019135490

(51) Int. Cl.
*H01J 37/317* (2006.01)
*H01L 21/265* (2006.01)
(Continued)

(52) U.S. Cl.
CPC .... *H01L 21/26586* (2013.01); *H01J 37/3171* (2013.01); *H01L 21/046* (2013.01); *H01L 21/047* (2013.01); *H01L 21/265* (2013.01); *H01L 21/2652* (2013.01); *H01L 29/36* (2013.01); *H01J 2237/24578* (2013.01); *H01J 2237/31703* (2013.01)

(58) Field of Classification Search
CPC ................................................. H01J 37/3171
See application file for complete search history.

(56) References Cited

U.S. PATENT DOCUMENTS

| | | | |
|---|---|---|---|
| 6,555,832 B1 * | 4/2003 | Ryding | H01J 37/3171 250/397 |
| 9,929,284 B1 | 3/2018 | Zhang et al. | |

(Continued)

FOREIGN PATENT DOCUMENTS

| | | |
|---|---|---|
| DE | 102016102865 A1 | 8/2017 |
| DE | 10 2017 117 999 A1 | 2/2019 |
| DE | 102017117999 A1 | 2/2019 |

*Primary Examiner* — Eliza W Osenbaugh-Stewart
(74) *Attorney, Agent, or Firm* — COOPER LEGAL GROUP, LLC

(57) ABSTRACT

In an example, a substrate is oriented to a target axis, wherein a residual angular misalignment between the target axis and a preselected crystal channel direction in the substrate is within an angular tolerance interval. Dopant ions are implanted into the substrate using an ion beam that propagates along an ion beam axis. The dopant ions are implanted at implant angles between the ion beam axis and the target axis. The implant angles are within an implant angle range. A channel acceptance width is effective for the preselected crystal channel direction. The implant angle range is greater than 80% of a sum of the channel acceptance width and twofold the angular tolerance interval. The implant angle range is smaller than 500% of the sum of the channel acceptance width and twofold the angular tolerance interval.

20 Claims, 11 Drawing Sheets

(51) Int. Cl.
*H01L 21/04* (2006.01)
*H01L 29/36* (2006.01)

(56) References Cited

U.S. PATENT DOCUMENTS

| | | |
|---|---|---|
| 10,037,887 B2 | 7/2018 | Brugger et al. |
| 2006/0138357 A1 | 6/2006 | Kim |
| 2008/0142899 A1 | 6/2008 | Morris et al. |
| 2009/0166564 A1 | 7/2009 | Moser et al. |
| 2013/0109110 A1 | 5/2013 | Sasaki et al. |
| 2016/0172438 A1 | 6/2016 | Jelinek et al. |
| 2017/0243747 A1 | 8/2017 | Brugger et al. |
| 2017/0271161 A1 | 9/2017 | Kawasaki et al. |
| 2017/0345891 A1 | 11/2017 | Van Brunt et al. |
| 2018/0069083 A1 | 3/2018 | Suvorov et al. |
| 2020/0027697 A1* | 1/2020 | Kawasaki ......... H01L 27/14658 |

* cited by examiner

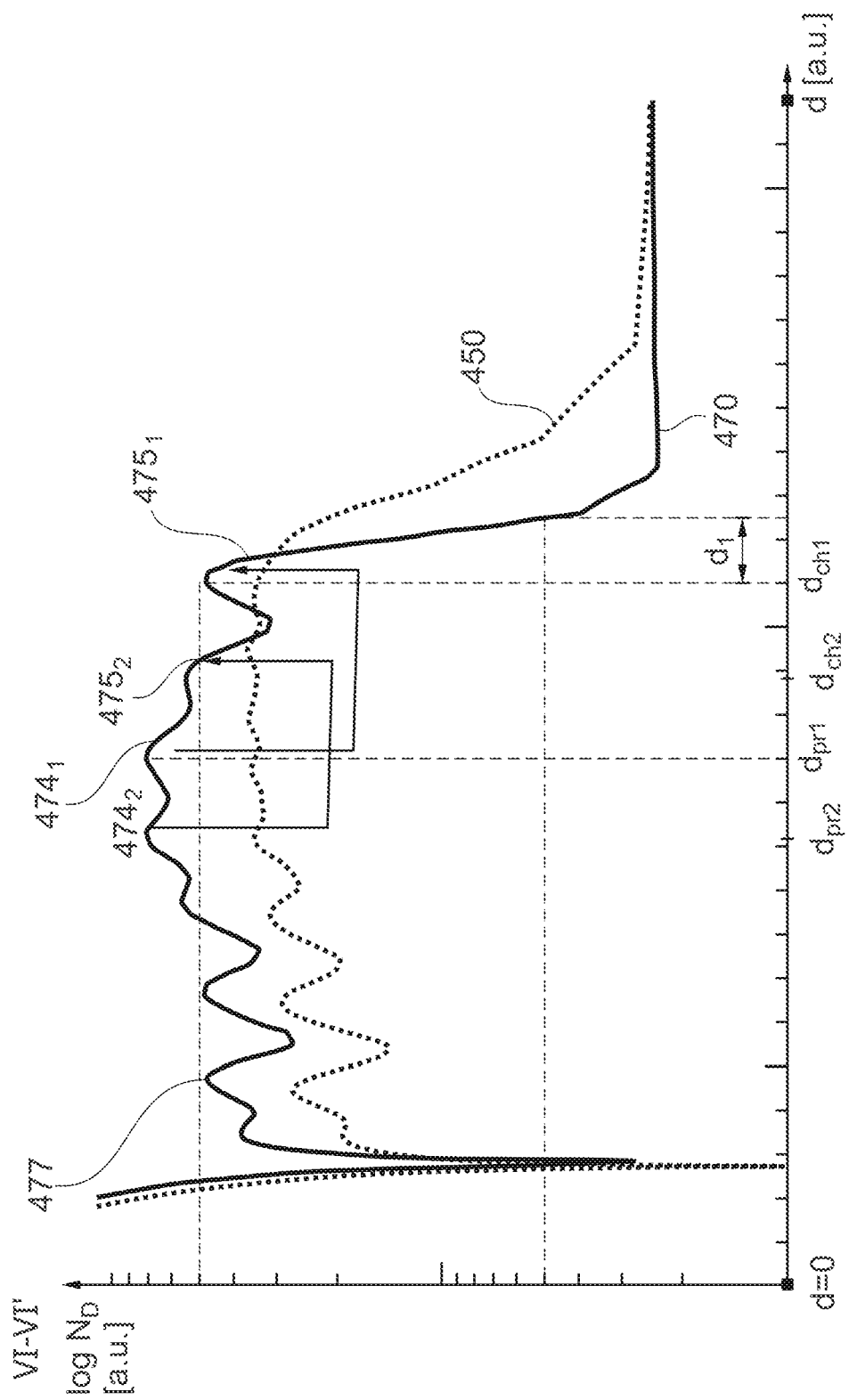

ION BEAM IMPLANTATION METHOD AND SEMICONDUCTOR DEVICE

RELATED APPLICATION

This application claims priority to German Patent Application No. 102019135490.0, filed on Dec. 20, 2019, entitled "ION BEAM IMPLANTATION METHOD AND SEMICONDUCTOR DEVICE", which is incorporated by reference herein in its entirety.

TECHNICAL FIELD

The present disclosure is related to an ion beam implantation method, to a method of manufacturing a semiconductor device and to a semiconductor device including a doped region.

BACKGROUND

If the direction of dopant ions incident upon the surface of a monocrystalline substrate is sufficiently tilted to major crystal directions in the substrate, the dopant ions predominately undergo large-angle scattering determining the final mean penetration depth of the dopant ions. If the direction of the dopant ions is approximately parallel to a major crystal direction, the dopant ions undergo to a high degree only small-angle scattering as the dopant ions pass through the crystal lattice. The dopant ions remain in the same crystal channel ("channeling") and can penetrate deeper into the crystalline substrate than in case of large-angle scattering. Therefore ion beam implantation using the channeling effect has the potential to form doped regions with end-of-range peaks deeper below the main surface of a crystalline substrate than the end-of-range peaks of doped regions formed without channeling and by using the same acceleration energy for the dopant ions. For channeling dopant ions, the distance between the end-of-range peak and the main surface may strongly depend on slight deviations between the crystal channel direction and the implant beam axis.

There is a need for an improved ion implantation method.

SUMMARY

An embodiment of the present disclosure relates to an ion beam implantation method. A substrate is oriented to a target axis, wherein a residual angular misalignment between the target axis and a preselected crystal channel direction in the substrate is within an angular tolerance interval. Dopant ions are implanted into the substrate using an ion beam that propagates along an ion beam axis. The dopant ions may be implanted, through the first substrate main surface of the substrate, into the substrate. The dopant ions are implanted at implant angles between the ion beam axis and the target axis. The ion beam may impinge in a same sub-region of the first substrate main surface for the implant angles at which the dopant ions are implanted. The implant angles are within an implant angle range. A channel acceptance width is effective for the preselected crystal channel direction. The implant angle range is greater than 80% of a sum of the channel acceptance width and twofold the angular tolerance interval. The implant angle range is smaller than 500% of the sum of the channel acceptance width and twofold the angular tolerance interval.

An embodiment of the present disclosure relates to a method of manufacturing a semiconductor device. A substrate of the semiconductor device is oriented to a target axis, wherein a residual angular misalignment between the target axis and a preselected crystal channel direction in the substrate is within an angular tolerance interval. Dopant ions are implanted into the substrate using an ion beam that propagates along an ion beam axis. The dopant ions are implanted at implant angles between the ion beam axis and the target axis. The implant angles are within an implant angle range. A channel acceptance width is effective for the preselected crystal channel direction. The implant angle range is greater than 80% of a sum of the channel acceptance width and twofold the angular tolerance interval. The implant angle range is smaller than 500% of the sum of the channel acceptance width and twofold the angular tolerance interval. The doped region includes a first local dopant concentration maximum at a first distance to a first surface of the substrate, a second local dopant concentration maximum at a second distance to the first surface, and a local dopant concentration minimum at a third distance to the first surface, wherein the third distance is between the first distance and the second distance. The first distance is greater than the second distance. A difference between the first distance and the second distance is in a range from 200 nanometers (nm) to 1500 nm. A ratio between the first local dopant concentration maximum and the second local dopant concentration maximum is in a range from 0.5 to 2. A ratio between a sum of the first local dopant concentration maximum and the second local dopant concentration maximum and the local dopant concentration minimum is in a range from 2 to 10.

An embodiment of the present disclosure relates to a semiconductor device. A semiconductor body includes a first surface and a doped region. The semiconductor body includes silicon carbide. The doped region includes a first local dopant concentration maximum at a first distance to the first surface, a second local dopant concentration maximum at a second distance to the first surface, and a local dopant concentration minimum at a third distance to the first surface, wherein the third distance is between the first distance and the second distance. Starting at the first distance to the first surface, a dopant concentration in the doped region decreases with increasing distance to the first surface by 90% of the first local dopant concentration maximum within at most 2 micrometers (μm).

BRIEF DESCRIPTION OF THE DRAWINGS

The accompanying drawings are included to provide a further understanding of the embodiments and are incorporated in and constitute a part of this specification. The drawings illustrate embodiments of an ion beam implantation method and a semiconductor device and together with the description serve to explain principles of the embodiments. Further embodiments are described in the following detailed description and the claims.

FIG. 7 is a schematic diagram showing another vertical dopant profile along line VI-VI in the semiconductor device of FIG. 3 according to an embodiment with multiple ion implantation processes.

DETAILED DESCRIPTION

Figure 1A:
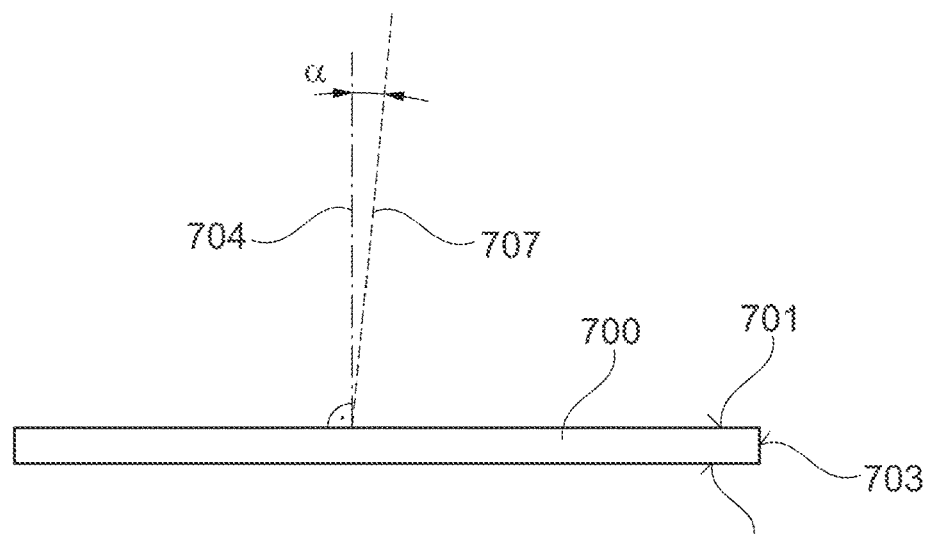
FIGS. 1A-1F include schematic side and plan views of a substrate for illustrating an ion beam implantation method according to an embodiment including substrate alignment and ion beam implantation at different implant angles.

In the following detailed description, reference is made to the accompanying drawings, which form a part hereof and in which are shown by way of illustrations specific embodiments in which an ion beam implantation method and a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "above" is not to be construed as meaning "directly on". Rather, if one element is positioned "above" another element (e.g., a layer is "above" another layer or "above" a substrate), a further component (e.g., a further layer) may be positioned between the two elements (e.g., a further layer may be positioned between a layer and a substrate if the layer is "above" said substrate).

As regards structures and doped regions formed in a substrate, a second region is "below" a first region, if a minimum distance between the second region and a first substrate main surface at the front side of the substrate is greater than a maximum distance between the first region and the first substrate main surface. The second region is "directly below" the first region, where the vertical projections of the first and second regions into the first substrate main surface overlap. The vertical projection is a projection orthogonal to the first substrate main surface.

Regions and/or structures may be laterally separated from each other in the same horizontal layer. Laterally separated regions and/or structures may also be vertically separated (i.e., be positioned in different horizontal layers). In the latter case, orthogonal projections of the separated regions and/or structures into a horizontal projection plane are laterally separated. Regions and/or structures in different horizontal layers laterally overlap, where orthogonal projections of the concerned regions and/or structures into a horizontal projection plane laterally overlap.

The term "power semiconductor device" refers to semiconductor devices with high voltage blocking capability of at least 30 V, for example 100 volts (V), 600 V, 3.3 kilovolts (kV) or more and with a nominal on-state current or forward current of at least 1 ampere (A), for example 10A or more.

Power semiconductor switches include IGBTs (insulated gate bipolar transistors), JFETs (junction field effect transistors) and IGFETs (insulated gate field effect transistor). IGFETs are voltage controlled devices including MOSFETs (metal oxide semiconductor FETs) and other FETs with gate electrodes based on doped semiconductor material and/or with gate dielectrics that are not or not exclusively based on an oxide.

The term "semiconductor body" used herein may refer to a substrate, a portion of a substrate, or other semiconductor structure.

According to an embodiment, an ion beam implantation method may include orienting a substrate to a target axis, wherein a residual angular misalignment between the target axis and a preselected crystal channel direction in the substrate may be within an angular tolerance interval.

The substrate may be a wafer-sized slice including single crystalline material (e.g., a wafer) or may include a single-crystalline material layer formed on a non-crystalline base substrate. The slice or the single-crystalline material layer may exclusively include single-crystalline material or may include, in addition to the single-crystalline material, structures of other materials, e.g., conductive structures and/or insulating structures.

The single crystalline material may be a ceramic, e.g., α-Al$_2$O$_3$a (sapphire), or a semiconductor material. The semiconductor material may be, by way of example, any group IV element semiconductor, e.g., silicon (Si) or germanium (Ge), any group IV compound semiconductor, e.g., silicon carbide (SiC) or silicon-germanium (Site), or any group III/V compound semiconductor, such as gallium arsenide (GaAs) or gallium nitride (GaN).

For example, the single crystalline material may be 15R-SiC (silicon carbide of 15R polytype) or silicon carbide with a hexagonal polytype, for example 2H-SiC, 4H-SiC or 6H-SiC, by way of example. In addition to the main constituents silicon and carbon, the single crystalline material may include dopant atoms, for example nitrogen N, phosphorus P, beryllium Be, boron B, aluminum Al, and/or gallium Ga. The single crystalline material may include further impurities caused by process imperfection and/or precursor impurities, for example hydrogen, fluorine, and/or oxygen.

The substrate may have two essentially parallel main surfaces of the same shape and size and a lateral outer surface connecting the edges of the two substrate main surfaces. The substrate may laterally extend in a plane spanned by lateral directions. Accordingly, the substrate may have a surface extension along two lateral directions (also denominated as horizontal directions in the following). The substrate may have a thickness along a vertical direction perpendicular to the lateral directions. A first substrate main surface at the front side and a second substrate main surface at the backside may have the shape of a polygon (e.g., a rectangle or a hexagon) with or without rounded edges, a circle, or a circle with a notch or with a flat along the circumference.

Any crystal direction, along which channeling effects outweigh the effect of large-angle scattering, may represent a crystal channel direction. For example, for a hexagonal crystal lattice, the crystal channel direction may be a major crystal direction, e.g., the <0001> lattice direction ("c-axis"), the <11-20> lattice directions ("a-axes"), the <1-100> lattice directions ("m-axes"), or the <11-23> lattice directions, by way of example. For a cubic crystal lattice, the crystal channel direction may be a major crystal direction, e.g., the <001> lattice direction, the <001> lattice direction, the <111> lattice direction, the <112> lattice direction, directions parallel to (111) planes and directions parallel to (022) planes, by way of example.

A user may preselect one of the available crystal channel directions as that crystal channel direction that defines the position of the end-of-range peak of channeling dopant ions at predetermined process conditions.

The target axis may be identical with an idle ion beam axis. The idle ion beam axis may be the default ion beam axis along which an ion beam propagates in an idle mode. In the idle mode an ion beam implantation apparatus uses a constant implant angle.

The residual angular misalignment (total incident angle variation) between the target axis and the preselected crystal channel direction may result from process imperfections of the process that orients the substrate to the target axis.

Process imperfections may result from mechanical restrictions of the ion beam implantation apparatus. For example, the ion beam implantation apparatus may include a substrate tilt mechanism. The substrate tilt mechanism may rotate the substrate about one horizontal axis of rotation parallel to the first substrate main surface. Alternatively, the substrate tilt mechanism may successively rotate the substrate about two differently oriented, e.g., orthogonal horizontal axes of rotation parallel to the first substrate main surface. The substrate tilt mechanism may align the preselected crystal channel direction to the target axis only with limited accuracy.

Alternatively or in addition, the ion beam implantation apparatus may include an ion beam projection apparatus with steerable ion beam axis. The ion beam projection apparatus may deflect the ion beam axis in one incident beam plane tilted to the first substrate main surface. Alternatively, the ion beam projection apparatus may be adapted to deflect the ion beam axis in two differently oriented, e.g., orthogonal incident beam planes. The ion beam projection apparatus may align the ion beam axis to the preselected channel direction only with limited accuracy.

Alternatively or in addition, the ion beam implantation apparatus may include a substrate rotation mechanism. The substrate rotation mechanism may rotate the substrate about a vertical axis through a lateral center of the first substrate main surface. The substrate rotation mechanism may align the preselected crystal channel direction to an incident plane, which is spanned by the surface normal and the ion beam axis, only with limited accuracy.

Typically, a total apparatus angular tolerance window, which includes tolerances for the substrate tilt mechanism and for the ion beam projection apparatus, may be in a range from 0.5 degrees to +0.5 degrees, for example from −0.2 degrees to +0.2 degrees or from −0.1 degrees to +0.1 degrees. Alternatively and/or additionally, tolerances for the substrate tilt mechanism and/or the ion beam projection apparatus may be outside the range from −0.5 degrees to +0.5 degrees.

In addition or alternatively, the process imperfections may concern an off-axis cut that defines the orientation of the first substrate main surface with respect to the major crystal directions including the preselected crystal channel direction. Typically, the angular tolerance window for the off-axis cut may be in a range from −0.5 degrees to +0.5 degrees, for example from −0.2 degrees to +0.2 degrees for silicon carbide (SiC) and silicon (Si), or from −0.1 degrees to +0.1 degrees, for example for silicon (Si). Alternatively and/or additionally, the angular tolerance window for the off-axis cut may be outside the range from −0.5 degrees to +0.5 degrees.

In addition or alternatively, the process imperfections may concern an angular deviation between an orientation indicator for a main lattice plane and an actual orientation of the same main lattice plane. For example, the surface of a flat or the direction of a notch at the outer circumference of the substrate may indicate the orientation of a predefined main lattice plane. Process imperfections may result in an angular deviation between the actual orientation of the predefined main lattice plane and the surface of the flat or between the actual orientation of the predefined main lattice plane and the direction indicated by the notch.

The total angular tolerance interval may be the sum of the total apparatus angular tolerance window and the angular tolerance windows for the off-axis cut and the orientation indicator. For example, the angular tolerance interval may be in a range from −1 degree to +1 degree, for example from −0.4 degrees to +0.4 degrees or from −0.2 degrees to +0.2 degrees.

The residual angular misalignment may be described by a first angular component and a second angular component, wherein the first and second angular components are defined in orthogonal directions. For example, the first angular component describes the angular deviation of the preselected crystal channel direction from the target axis in a vertical plane orthogonal to a horizontal axis of rotation of the substrate tilt mechanism. A second angular component may describe the angular deviation of the vertical projection of the preselected crystal channel direction onto the first substrate main surface from the vertical projection of the target axis onto the first substrate main surface.

Dopant ions may be implanted into the substrate by using a directed ion beam. The ion beam propagates along an ion beam axis. In a collimated ion beam, the dopant ions move parallel to the ion beam axis. In a diverging ion beam, the ion beam axis is the symmetry axis of the ion beam. The dopant ions may be implanted, through the first substrate main surface of the substrate, into the substrate.

The dopant ions may be implanted at different implant angles. The respective implant angle is the angle between the ion beam axis and the target axis.

For example, the substrate tilt mechanism may tilt the substrate by different tilt angles about a horizontal axis of rotation parallel to the first substrate main surface. Alternatively, the ion beam projection apparatus may deflect the ion beam axis at different deflection angles in the incident plane.

Alternatively, the substrate rotation mechanism may rotate the substrate by different twist angles.

The implant angle may continuously change during the ion implantation process. Alternatively, the implant angle may change in discrete acts.

The implant angles may be within an implant angle range. The implant angle range may be symmetric with respect to the target axis. Alternatively, the implant angle range may be slightly asymmetric with respect to the target axis. For example, a first implant angle sub-range at a first side of the target axis may cover 40% to 50% of the complete implant angle range.

Each crystal channel direction may have a specific channel acceptance width. The channel acceptance width (or channeling probability distribution) is a measure for the angular dependency of the channeling efficiency. The angular-dependent channeling efficiency may be symmetric with respect to the crystal channel direction and may have a global maximum at the respective crystal channel direction. The channel acceptance width may be defined by the FWHM (full width half maximum) value. Typically, the angular-dependent channeling efficiency can be approximated by a Gaussian angular distribution. Alternatively and/or additionally, the angular-dependent channeling efficiency can be determined and/or approximated by using one or more other techniques. The channel acceptance width may be a function of ion type, ion energy and ion dose, by way of example.

The implant angle range may be greater than 80%, e.g., greater than 90% or greater than 100% of the sum of the channel acceptance width of the preselected crystal channel direction and twofold the angular tolerance interval. In addition, the implant angle range may be smaller than 500%, e.g., smaller than 400% or smaller than 250% of the sum of the channel acceptance width of the preselected crystal channel direction and twofold the angular tolerance interval. The implant angle range may be smaller than five times, e.g., smaller than four times or smaller than 2.5 times the sum of the channel acceptance width of the preselected crystal channel direction and twofold the angular tolerance interval. With these preconditions fulfilled, channeling may be effective for the same or for at least approximately the same amount of ion dopants, irrespective of the actual angular misalignment between target axis and preselected crystal channel direction. For example, for a given channeling acceptance width, the implant angle range may be selected as small as possible to achieve a high channeling portion at sufficient process stability (e.g., a channeling potion that meets a threshold channeling efficiency at a process stability that meets a threshold process stability).

An implant sweep may include one complete pass of the implant angle range. For example, the implant sweep may include a tilt of the substrate about a horizontal axis of rotation parallel to the first substrate main surface by the implant angle range. According to another example, the implant sweep may include a twist of the substrate about a vertical axis of rotation by a rotational angular range. The rotational angular range may be derived from the implant angle range and may depend on characteristics of the preselected crystal channel direction.

The act of implanting the dopant ions into the substrate may include one or more implant sweeps along one single axis of rotation. For example, implanting the dopant ions may include one or more implant sweeps orthogonal to a first horizontal axis of rotation of a substrate tilt mechanism. Alternatively, implanting the dopant ions may include one or more rotational sweeps ("twists") around a vertical axis or rotation.

Alternatively, implanting the dopant ions may include successive implant sweeps along two or more axes of rotation. For example, implanting the dopant ions may include at least one implant sweep orthogonal to a first horizontal axis of rotation of a substrate tilt mechanism and at least one implant sweep orthogonal to a second horizontal axis of rotation of the substrate tilt mechanism, wherein the second horizontal axis may by perpendicular to the first horizontal axis. Alternatively, implanting the dopant ions may include at least one implant sweep orthogonal to a horizontal axis of rotation of a substrate tilt mechanism and at least one rotational sweep around a vertical axis of rotation.

In this way, the amount of "channeling" dopant ions may be decoupled (and/or decoupled to a high degree) from the exact value of the angular misalignment between the crystal channel direction and the target axis. As a consequence, the distance between the end-of-range peak of the channeling dopant ions ("channeling peak") and the first substrate main surface is the same or approximately the same, irrespective of the actual angular misalignment between target axis and preselected crystal channel direction. In addition, the maximum dopant concentration at the channeling peak may be independent from (and/or to a high degree independent from) the actual angular misalignment between target axis and preselected crystal channel direction.

The method may facilitate the practical and productive use of channeling dopant ions for a great variety of applications using substrates with typical angular deviations for the off-axis cut and/or using ion beam implantation apparatuses with a substrate tilt mechanism with typical orientation precision.

Channeling dopant ions may facilitate the formation of dopant regions with local dopant maxima at a comparatively great vertical distance to a substrate main surface and/or may contribute to reducing the maximum implantation energy. For example, the vertical distance to the substrate main surface may be larger (as a result of the channeling dopant ions, for example), as compared to a vertical distance between a substrate main surface and dopant regions (with local dopant maxima) that are formed without channeling dopant ions. Ion implantation at lower implantation energy may reduce negative side effects such as damage of existing structures, damage of the semiconductor crystal lattice and/or may facilitate the use of thinner implantation masks.

Furthermore, the non-channeling dopant ions distribute in the substrate between the first substrate main surface and the channeling peak. The distribution of the non-channeling dopant ions may be tuned by process parameters such as the implant angle range, the distribution of the implant angles within the implant angle range, implant energy, implant temperature, and/or implant dose for each sub-implant. For example, the process parameters may be selected such that the distribution of the non-channeling dopant ions includes a further end-of-range peak ("primary peak") between the first substrate main surface and the channeling peak.

The primary peak and the channeling peak may be defined such that the vertical dopant concentration profile of the implanted dopant ions approximates a desired profile, e.g., a wide, plateau-like dopant profile with a less pronounced minimum or a dopant profile with two pronounced peaks. In this way, the method may facilitate formation of a vast variety of vertical dopant profiles with one single implant process. In particular, the ratio between the dopant concentrations at the channeling peak and at the primary peak may be adjusted by selecting an appropriate angular amount for the implant angle range and/or by selecting appropriate implant angles, i.e. an appropriate distribution of the implant angles within the implant angle range.

According to an embodiment, the implant angle (and/or the ion beam) may continuously sweep the implant angle range at least once during implanting the dopant ions. In this context, "continuously" may mean that two consecutive angles (e.g., two directly consecutive angles) may differ by at most 1° (or at most 0.1°) and/or by at most 10% (or at most 1%) of at least one of the consecutive angles. For example, during one single implant process about one rotational axis, the implant beam (e.g., the ion beam) may sweep across the complete implant angle range once, twice or even more often. During each angular sweep, the implant beam may impinge in the same or approximately in the same sub-region of the first substrate main surface. For example, the first substrate main surface may be completely within the implant beam cone. The implant beam cone may consist of a wide single beam or of a fast 2D-scanned spot beam. The fast 2D-scanning can be electrostatic- or magnetic scanning in X- and Y-direction with frequencies in a range from a few Hz up to a few kHz, for example.

During each sweep, the mean dopant ion flow in the ion beam may be constant or approximately constant. The ratio between the dopant concentrations at the channeling peak and at the primary peak may be adjusted by the angular speed of the angular sweep.

Varying the angular speed as a function of the implant angle may facilitate further variations of the vertical dopant profile without altering the dopant ion flow in the ion beam.

The continuous sweep may be effected by a continuous rotation about a horizontal axis of rotation of a substrate tilt mechanism, by a continuously decreasing or increasing deflection of the ion beam axis in a beam plane of an ion beam projection apparatus with steerable ion beam axis, or by a continuous rotation about the vertical rotational axis of a substrate rotation mechanism.

According to an embodiment, implanting the dopant ions may include nmax implant sub-processes at nmax different implant angles between the ion beam axis and the target axis. Nmax may be at least 2, for example at least 7, at least 15 or at least 16. Each implant sub-process may be effective for a constant implant angle. The method may be performed at ion beam implantation apparatuses which provide the functionality of changing the implant angle between successive ion implant sub-processes ("shots"). The ion implant sub-processes may follow directly one after another without intermediate calibration and/or tuning processes. Alternatively, a re-tuning and/or re-calibration process may be performed once between at least two successive ion implant sub-processes, between some of the ion implant sub-processes or between each pair of successive ion implant sub-processes.

The different implant angles may be effected by changing in steps the tilt angle about a horizontal axis of rotation of a substrate tilt mechanism, by decreasing or increasing in steps a deflection angle of the ion beam axis in an ion beam projection apparatus with steerable ion beam axis, or by a stepwise rotation about the vertical rotational axis of a substrate rotation mechanism. For a rotational sweep, a rotational sweep range about the vertical axis of rotation may be a function of the implant angle range and may depend from the preselected crystal channel direction and/or the substrate material.

For each implant sub-process, the total dopant ion flow in the ion beam may be constant or approximately constant. In other words, each implant sub-process may approximately implant the same amount of dopant ions, i.e. the same dopant ion dose. In case the ion beam implantation apparatus allows nmax implant sub-processes within the same recipe and without further tuning and/or calibration of the ion beam, it is possible that the split of the implant process into nmax implant sub-processes has no or only marginal impact on the total process time (e.g., the split of the implant process into nmax implant sub-processes may not cause the total process time to change or may cause the total process time to change by an amount of time that is less than a threshold amount of time).

Alternatively, at least one implant sub-process may implant an amount of dopant ions that differs from the amount of dopant ions implanted through at least one of the other implant sub-processes.

For each implant sub-process, the acceleration voltage used to accelerate the dopant ions may be identical or almost identical. Alternatively, at least one implant sub-process may use an acceleration voltage that differs from the acceleration voltage used in at least one of the other implant sub-processes.

According to an embodiment, the nmax implant angles of a multi-act implant process including a plurality of implant sub-processes may be equally spaced. In other words, each implant angle may have the same angular distance to its neighboring implant angle. In this way it is possible that the position of the channeling peak and the dopant concentration at the channeling peak are highly independent from the actual residual misalignment angle between the target axis and the preselected crystal channel direction. According to other embodiments the angular distance between neighboring implant angles may be a function of the distance of the respective implant angles to the angular center of the implant angle range. For example, the angular distance between neighboring implant angles may decrease or increase monotonically or strictly monotonically. Also other distributions of the implant angles may be possible. For example, the nmax implant angles may result from equiangular distances (twist angles) between neighboring implant positions of a substrate rotation mechanism.

According to an embodiment, the nmax implant sub-processes may include implant sub-process pairs, wherein the implant angles of each implant sub-process pair are symmetric with respect to an angular center of the implant angle range. In this way it may be possible that the resulting doping profiles are independent from (and/or to a high degree independent from) the angular direction of an angular deviation of the off-axis cut and/or independent from the angular direction of a tilt error angle of a substrate tilt mechanism.

According to an embodiment, at least one of the implant angles may be 0 degrees or deviates by at most 0.3 degrees from 0 degrees. In other words, one implant sub-process may be performed with the ion beam axis parallel to the target axis, i.e. along the idle ion beam axis. The target axis may be as close as possible to the selected channel direction.

For example, in case of a silicon carbide substrate with 4 degrees off-axis cut, at an implant angle of 0 degrees between the target axis and the ion beam axis, the ion beam axis may have a tilt angle of about 4 degrees against the surface normal provided that the <0001> lattice direction is the selected channel direction. In case the <11-23> lattice direction is the selected channel direction, the ion beam axis may have a tilt angle of 21 degrees or 13 degrees against the surface normal for an implant angle of 0 degrees.

In case of a single-crystalline silicon substrate with (001) lattice planes parallel to the main surfaces, at an implant angle of 0 degrees between target axis and ion beam axis, the ion beam axis is almost perpendicular to the first surface in case the <001> lattice direction is the selected channel direction.

According to an embodiment, neighboring implant angles may differ by at most 0.5 degrees, for example by at most 0.2 degrees or by at most 0.1 degrees. For example, starting from a first boundary angle of the implant angle range, the implant angles of the implant sub-processes may change in regular angular steps of 0.5 degrees until the second boundary angle of the implant angle range is reached. According to another example, the angular step width may be 0.2 degrees or 0.1 degrees.

For a rotational sweep about a vertical axis of rotation, an angular distance between neighboring implant positions may depend on the total rotational sweep range, which in turn may depend on the preselected crystal channel direction. For example, the mean angular distance between neighboring implant positions may be in a range from 3% to 10% of the rotational sweep range. According to another example, the angular distance between neighboring implant positions may be in a range from 0.1 degrees to 1 degree, e.g., 0.1 degrees to 0.5 degrees.

For example, in combination with fifteen implant sub-processes, it is possible that the position of the channeling peak and the dopant concentration at the channeling peak may be highly decoupled from the actual angular misalignment between the target axis and the preselected crystal channel direction for a channel acceptance width of about 0.6 degrees or less. A channel acceptance width of about 0.6 degrees may be a reasonable approximation for the c-axis of a hexagonal silicon carbide lattice, by way of example.

According to an embodiment, the implant angle range is at most 6 degrees, for example at most 5 degrees or at most 4 degrees. According to other examples, the implant angle range may be at most 3 degrees, 2 degrees, 1 degree or 0.2 degrees. For example, the implant angle range may be the channel acceptance width increased by 0.8 degrees. The 0.8 degrees may represent a typical upper limit for the sum of the angular tolerance windows for the substrate tilt mechanism and the off-axis cut. A comparatively small—but sufficiently large—implant angle range (e.g., an implant angle range that is smaller than a first threshold implant angle range and larger than a second threshold implant angle range) may sufficiently define the dopant concentration around the channeling peak with low additional effort.

According to an embodiment, prior to implanting, an angular deviation between a lateral target direction and a lateral major crystal direction in the substrate may be determined. Alternatively and/or additionally, the angular deviation may be determined during or after implanting.

The ion beam axes and the target axis span an implant angle plane. The lateral target direction may have an arbitrary—but predefined—orientation with respect to the implant angle plane. For example, the implant angle plane may run orthogonal or parallel to the lateral target direction. For substrates with hexagonal crystal lattice and off-axis cut, the lateral major crystal direction may depend on the direction of the off-axis cut. For example, the lateral major crystal direction may be a <11-20> lattice direction or a <1-700> lattice direction.

The angular deviation may be determined by a measurement unit, for example by optical means detecting the orientation of ribs at the first substrate main surface. The ribs may result from the off-axis cut and may extend orthogonal or parallel to the lateral major crystal direction, by way of example. Alternatively, data indicating the angular deviation with respect to a notch or with respect to a flat at the outer circumference of the substrate may be received and analyzed.

Then, further prior to implanting the dopant ions, the lateral major crystal axis may be aligned to the lateral target direction. Alternatively and/or additionally, the lateral major crystal axis may be aligned to the lateral target direction during or after implanting the dopant ions. The process of aligning may include a rotational movement of the substrate ("twist"). A remaining rotational misalignment between the lateral target direction and the lateral major crystal axis may be at most 0.5 degrees, e.g., at most 0.2 degrees or at most 0.1 degrees.

As a consequence, for the complete implant process, the implant angle plane may have a predefined orientation with respect to the crystal lattice. The implantation conditions for different substrates of the same type may be in closer agreement with each other. The additional alignment process may improve reproducibility of the implant results across a plurality of substrates of the same type. The rotational alignment may follow or may precede a beam-tilt alignment using a substrate tilt mechanism and/or an ion beam projection apparatus with steerable ion beam axis as described above.

The rotational alignment may substitute a rotational sweep. Alternatively, the rotational alignment may be combined with a rotational sweep. For example, the angular positon achieved by the rotational alignment may be used as the angular center of at least one rotational sweep. The sweep range may be symmetric or asymmetric with respect to the angular center.

For example, with the angular center at 0 degrees, for a rotational sweep about a vertical axis of rotation, the total rotational sweep range for the implant positions may be in a range from −14 degrees to +14 degrees, from −4.9 degrees to +4.9 degrees, from −2.1 degrees to +2.1 degrees, from 1.4 degrees to +1.4 degrees, or from −0.7 degrees to +0.7 degrees, by way of example.

According to an embodiment a semiconductor device may include a semiconductor body with a first surface and with a doped region.

The semiconductor device may be a power semiconductor device, e.g., a power semiconductor switch or a power semiconductor diode. The semiconductor body may include a semiconductor material. The semiconductor material may include silicon carbide, e.g., silicon carbide with a hexagonal crystal lattice. A second surface of the semiconductor body may be parallel or at least approximately parallel to the first surface. The first and second surfaces may extend along lateral directions and may have the same shape and size.

The doped region may include a first local dopant concentration maximum at a first distance to the first surface, a second local dopant concentration maximum at a second distance to the first surface, and a local dopant concentration minimum between the first distance and the second distance. For example, the doped region may comprise the local dopant concentration minimum at a third distance to the first surface. The third distance may be between the first distance and the second distance. The first distance may be greater than the second distance.

One of the first and second local dopant concentration maxima may be the global local dopant concentration maximum. Alternatively, none of the first and second local dopant concentration maxima is the global local dopant concentration maximum.

A difference between the first distance and the second distance may be in a range from 200 nanometers (nm) to 1500 nm, e.g., from 300 nm to 1000 nm. According to an embodiment the difference between the first distance and the second distance may be in a range from 400 nm to 550 nm. A ratio between the first local dopant concentration maximum and the second local dopant concentration maximum may be in a range from 0.5 to 2. According to an embodiment, the ratio between the first local dopant concentration maximum and the second local dopant concentration maximum may be in a range from 0.9 to 1.1. A ratio between the sum of the first local dopant concentration maximum and the second local dopant concentration maximum on the one hand and the local dopant concentration minimum on the other hand may be in a range from 2 to 10. According to an embodiment, the ratio between the sum of the first local dopant concentration maximum and the second local dopant concentration maximum on the one hand and the local dopant concentration minimum on the other hand may be in a range from 5 to 7.

A vertical dopant concentration profile reflects the dopant concentration along a vertical direction orthogonal to the first surface. The vertical dopant concentration profile with the afore-mentioned characteristics may approximate box-shaped vertical dopant profiles for some applications to a sufficient degree and may be formed at comparatively low effort (e.g., the vertical dopant concentration profile with the afore-mentioned characteristics may be formed with less effort than other vertical dopant concentration profiles with other characteristics). For a further smoothening of the resulting doping profile, the implantation energy or/and the implantation dose may be varied for the implants at different angles.

According to an embodiment, a vertical dopant concentration profile of the doped region may include a first trailing slope and a second trailing slope. The first trailing slope may be between the second local dopant concentration maximum and the local dopant concentration minimum. The second trailing slope may be between the first local dopant concentration maximum and a second surface of the semiconductor body. The second trailing slope may be steeper than the first trailing slope.

The second surface may be opposite to the first surface. The vertical dopant concentration profile with twin peaks and steeper trailing slope at the deeper end-of-range peak may be formed in an effective way by using channeling dopant ions. The channeling dopant ions may facilitate a doped region with a bottom edge having a comparatively large distance to the first surface. For example, the distance from the bottom edge to the first surface may be larger (as a result of the channeling dopant ions, for example), as compared to a distance between a surface and a bottom edge of a dopant region formed without channeling dopant ions.

According to an embodiment, forming the doped region may include implanting dopant ions into the semiconductor body by using an ion beam implantation method as described above. The doped region may be formed in an efficient way by a comparatively low number of implant acts. For example, by implementing one or more of the techniques provided herein (e.g., one or more techniques for ion beam implantation as described above), the doped region may be formed by performing a lower number of implant acts, as compared to forming a doped region without implementing one or more of the techniques provided herein.

According to an embodiment, the semiconductor device may include a gate structure. The gate structure may extend from the first surface into the semiconductor body. The gate structure may be in contact with the doped region. The doped region may form at least part of a source region, a body region or a current spread region of a transistor cell of a power semiconductor switch or MCD (MOS controlled diode). A source region, a body region and/or a current spread region including the above-mentioned characteristics of the doped region may improve device characteristics of the semiconductor device at comparatively low additional effort and/or may contribute in simplifying the manufacturing process, e.g., by reducing the number of implant acts and/or by reducing the maximum acceleration energy. For example, implementing a source region, a body region and/or a current spread region including at least some of the above-mentioned characteristics of the doped region may provide for improved device characteristics of the semiconductor device, as compared to semiconductor devices that do not include at least some of the above-mentioned characteristics. Alternatively and/or additionally, the semiconductor device with a source region, a body region and/or a current spread region including at least some of the above-mentioned characteristics of the doped region may be implemented with less effort than implementing semiconductor devices with a source region, a body region and/or a current spread region that do not include at least some of the above-mentioned characteristics.

According to an embodiment, the semiconductor device may include a body region in contact with the doped region and in contact with the gate structure. The doped region and the body region may form a pn junction. The doped region may be formed between the first surface and the body region. For example, the doped region may form a source region of a vertical transistor cell with vertical load current flow through the body region.

In a source region of a vertical transistor cell, a vertical dopant concentration profile including at least two peaks as described above may allow for adjusting a total bulk resistance of the source region with only low adverse side effects on the ohmic contact resistance between a source metallization and the source region and on the characteristics of the pn junction between source region and body region.

The bulk resistance may be adjusted for providing a voltage drop during a short-circuit condition. The voltage drop enables counteracting current filaments and may reduce the effective gate overvoltage. When adjusting the bulk resistance of the source region, a trade-off between i) counteracting current filaments and/or reduced effective gate overvoltage during short-circuit current load by increasing the bulk resistance of the source region and ii) decreasing an on-state resistance of the device by decreasing the bulk resistance of the source region may also be taken into account, for example.

According to an embodiment, the semiconductor device may include a source region in contact with the doped region and in contact with the gate structure. The doped region and the source region may form a pn junction. The source region may be formed between the first surface and the doped region. For example, the doped region may form a body region of a vertical transistor cell.

For example, the semiconductor material may include silicon carbide and the dopant ions may include aluminum ions. Due to the channeling effect, the acceleration energy may be comparatively low for a given vertical extension of the body region. For example, the acceleration energy may be lower for a given vertical extension of the body region as a result of the channeling effect (e.g., the channeling effect, along a crystal channel direction, used for channeling dopant ions to form the doped region, for example), as compared to an acceleration energy for a given vertical extension of a body region of a doped region that is formed without using the channeling effect. The lower acceleration energy may reduce defect density in the body region after ion beam implantation and/or may reduce waviness of the vertical dopant concentration profile. The channeling portion of the vertical dopant concentration profile may increase the conductivity at the drain-side of the body region without affecting the threshold voltage. In SiC-IGBTs, a higher transverse conductivity at the drain-sided end of the body region may improve latch-up ruggedness. Furthermore, the detrimental effect of drain-induced barrier lowering may be reduced by such doping profiles. According to another example, the semiconductor material may include single-crystalline silicon and the dopant ions may include boron ions.

According to an embodiment, the semiconductor device may include a body region in contact with the doped region and in contact with the gate structure. The doped region and the body region may form a pn junction. The body region may be formed between the first surface and the doped region. For example, the doped region may form a current spread region of a vertical transistor cell. Due to the channeling effect used for defining the first dopant concentration maximum, the current spread region may extend comparatively deep into the semiconductor body. For example, the current spread region may extend deeper into the semiconductor body (as a result of using the channeling effect for defining the first dopant concentration maximum), as compared to a current spread region that is formed without using the channeling effect to define a dopant concentration maximum.

A current spread region with a channeling peak as that local dopant concentration maximum with the greatest distance to the first surface and with a steep trailing edge towards a lightly doped drift zone may combine high lateral conductivity (e.g., lateral conductivity exceeding a threshold conductivity) with a low vertical extension (e.g., a vertical extension less than a threshold vertical extension) of the highly conductive thin layer portion. In other words, the current spread region may efficiently laterally spread the on-state current at comparatively low adverse impact on blocking capability and/or on-state resistance. For example, the current spread region may laterally spread the on-state current with lower impact (e.g., adverse impact) on the blocking capability and/or the on-state resistance as compared to other current spread regions that do not have at least some of the characteristics provided herein.

According to an embodiment, the vertical dopant concentration profile of the doped region may include at least one further local dopant concentration maximum between the first surface and the second distance. For example, the vertical dopant concentration profile of the doped region may include at least one further local dopant concentration maximum between the first surface and the second local dopant concentration maximum. Further local dopant concentration maxima may result from further ion beam implantation processes. The further ion beam implantation processes may exclusively include ion beam implantation without channeling dopant ions. Alternatively, the further ion beam implantation processes may include at least one further ion beam implantation process using varying implant angles around a target axis and using channeling dopant ions as described above.

The further local dopant concentration maxima may contribute to improving a flatness of the vertical doping concentration profile of the doped region. For example, the further local dopant concentration maxima may improve flatness of the vertical dopant concentration profile of a body region and/or a current spread region.

According to an embodiment a semiconductor device may include a semiconductor body with a first surface and with a doped region. The doped region may include a first local dopant concentration maximum at a first distance to the first surface, a second local dopant concentration maximum at a second distance to the first surface, and a local dopant concentration minimum between the first distance and the second distance. For example, the doped region may comprise the local dopant concentration minimum at a third distance to the first surface. The third distance may be between the first distance and the second distance. The semiconductor body may include silicon carbide. Starting from the first distance, a dopant concentration in the doped region may decrease with increasing distance to the first surface by 10% (or 90%) of the first local dopant concentration maximum within at most 2 micrometers (μm), e.g., at most 1.8 μm. For example, starting at the first distance to the first surface, the dopant concentration in the doped region may decrease with increasing distance to the first surface by at least 10% (or at least 90%) of the first local dopant concentration maximum within at most 2 micrometers (μm), e.g., at most 1.8 μm.

According to an embodiment, the semiconductor device may include a gate structure, wherein the gate structure may extend from the first surface into the semiconductor body. The doped region may be in contact with the gate structure. A body region may be in contact with the doped region and the gate structure. A source region may be in contact with the body region and the gate structure. The body region may separate the source region and the doped region. A vertical dopant concentration profile of the doped region may include at least one further local dopant concentration maximum between the first surface and the second distance and at least one further local dopant concentration maximum between the second distance and the first distance. For example, the vertical dopant concentration profile of the doped region may include at least one further local dopant concentration maximum between the second local dopant concentration maximum and the first local dopant concentration maximum.

Embodiments of the ion beam implantation method described herein may be used for a method of manufacturing embodiments of the semiconductor device as described herein. In at least some embodiments of the semiconductor device manufacturing method and/or the semiconductor device, the following features (if applicable) apply alone or in combination:

(i) The doped region may form a shielding region for a gate structure of a vertical transistor cell, wherein the shielding region has the conductivity type of the body region, wherein a portion of the shielding region may be formed between the gate structure and the second surface of the semiconductor body, wherein a channeling peak may be located between a bottom of the gate structure and the second surface, wherein the shielding region and a source metallization may form a low-resistive ohmic contact, and wherein the semiconductor device may be a power semiconductor switch. The channeling dopant ions may facilitate a larger vertical extension of the shielding region and/or better shielding efficiency at low additional effort.

(ii) The doped region may form at least a portion of a junction termination region, wherein the junction termination region may be p doped, wherein the junction termination region may be formed in an edge region of the semiconductor body, wherein the edge region may laterally surround a central region that includes functional transistor cells or a main pn junction of a power semiconductor diode, wherein the junction termination region may surround the central region, and wherein the semiconductor device may be a power semiconductor diode or a power semiconductor switch. The channeling dopant ions may facilitate a larger vertical extension and/or a higher efficiency of the junction termination region at low additional effort.

(iii) The doped region may form a field ring, wherein the field ring may be p doped, wherein the field ring may be formed in an edge region of the semiconductor body, wherein the edge region may laterally surround a central region that includes functional transistor cells or a main pn junction of a power semiconductor diode, wherein the field ring may surround the central region, and wherein the semiconductor device may be a power semiconductor diode or a power semiconductor switch. The channeling dopant ions may facilitate a larger vertical extension and/or a higher efficiency of the field ring at low additional effort.

(iv) The doped region may form a channel stopper zone, wherein the channel stopper zone may be n doped, wherein the channel stopper zone may be formed in an edge region of the semiconductor body, wherein the edge region may laterally surround a central region that includes functional transistor cells or a main pn junction of a power semiconductor diode, wherein the channel stopper zone may surround the central region, wherein the channel stopper zone may be in contact with the lateral outer surface of the semiconductor body, and wherein the semiconductor device may be a power semiconductor diode or a power semiconductor switch.

The channeling dopant ions may facilitate a larger vertical extension and/or a higher efficiency of the channel stopper zone at low additional effort.

(v) The ion beam implantation method may form a field stop or buffer zone, wherein the field stop or buffer zone may have the conductivity type of the source region of a transistor cell, wherein the field stop or buffer zone may be formed between a voltage sustaining layer and a heavily doped contact layer, wherein the voltage sustaining layer may include a lightly doped drift zone of the conductivity type of the source region and/or a compensation structure, e.g., a superjunction structure, wherein the contact layer and a rear side metallization form a low-resistive ohmic contact, wherein the rear side metallization may be in contact with the second surface of the semiconductor body, wherein in the field stop or buffer zone a dopant concentration may steadily decrease with increasing distance to the second surface, and wherein the semiconductor device may be a power semiconductor diode or a power semiconductor switch. The dopant ions may be implanted through the second surface. The dopant ions may include protons. In case the semiconductor material includes SiC, the dopant ions may include phosphorus ions and/or nitrogen ions. The channeling dopant ions may facilitate a larger vertical extension of the field stop or buffer zone at low additional effort.

For a realization of the drift zone and of the buffer/field stop zone by epitaxial techniques the epitaxial process may be interrupted (after reaching a well-defined thickness, for example) to implement the buffer layer by the process described above whereby the implantation will be implemented into the surface defined by the epitaxial deposition; the epitaxial deposition of the drift zone may be performed (e.g., the epitaxial deposition may be performed after reaching the well-defined thickness, after the buffer layer is implemented and/or after the implantation is implemented into the surface).

(vi) The ion beam implantation method may form an emitter layer in the semiconductor body, wherein the emitter layer may have the conductivity type of the body region, wherein the emitter layer and a rear side metallization form a low-resistive ohmic contact, wherein the rear side metallization may be in contact with the second surface of the semiconductor body, wherein the emitter layer is formed between the rear side metallization and a field stop zone, and wherein the semiconductor device may be an IGBT, e.g., a reverse blocking IGBT. The dopant ions may be implanted through the second surface. The dopant ions may include protons for the realization of a field stop zone. In case the semiconductor material includes SiC, the dopant ions may include phosphorus ions and/or nitrogen ions for the realization of the buffer layer/field stop zone. The channeling dopant ions may facilitate a comparatively small distance between the emitter layer and a dopant concentration maximum, e.g., a proton density maximum, in the field stop zone at low additional effort. For example, the distance between the emitter layer and the dopant concentration maximum in the field stop zone may be smaller (as a result of the channeling dopant ions, for example), as compared to a distance between an emitter layer and a dopant concentration maximum in a field stop zone formed without channeling dopant ions. Reducing the distance between emitter layer and dopant concentration maximum in the field stop zone may contribute to improving short-circuit ruggedness and/or to reducing a leakage current (vii) The ion beam implantation method may form a doped column or a portion of a doped column of a superjunction structure, wherein the superjunction structure may be formed in a voltage sustaining layer of the semiconductor body, and wherein the semiconductor device may be a power semiconductor switch or a power semiconductor diode. The channeling dopant ions may contribute to increasing a vertical extension of the superjunction structure at comparatively low additional effort. For example, the vertical extension of the superjunction structure may be increased (and/or the superjunction structure may be formed) with less effort (as a result of the channeling dopant ions, for example), as compared to increasing a vertical extension of a superjunction structure (and/or forming the superjunction structure) without the channeling dopant ions. In a multi-epi/multi-implant process the use of channeling dopant ions may contribute in reducing the total number of epitaxial sublayers.

(viii) A method of manufacturing semiconductor devices may include forming a stray layer on the first substrate main surface of a semiconductor substrate, patterning the stray layer, and implanting dopant ions through the patterned stray layer using an ion beam implantation method with varying implant angles around a target axis and using channeling dopant ions as described above. The patterned stray layer may include a main portion with a first thickness and at least one further portion, in which the stray layer is absent or in which the stray layer has a thickness significantly deviating from the first thickness (e.g., a difference between the first thickness and the thickness of the stray layer exceeds a threshold difference). The patterned stray layer may facilitate forming laterally varying dopant profiles at low additional effort.

FIGS. 1A-1F concern the alignment of a substrate 700 and the implant of dopant ions into the substrate 700 at different implant angles. The substrate 700 may include silicon carbide of a hexagonal polytype. A preselected crystal channel direction 707 for channeling dopant ions may be the c-axis.

FIG. 1A shows the substrate 700 with a first substrate main surface 701 at a front side, a second substrate main surface 702 at a back side, and a lateral outer surface 703 that connects the edges of the two substrate main surfaces 701, 702. In the illustrated embodiment, the preselected crystal channel direction 707 for channeling is the c-axis, which is tilted to the normal 704 onto the first substrate main surface 701 by an off-axis cut angle α. The off-axis cut angle α may be in a range from 3 degrees to 5 degrees, e.g., about 4 degrees, by way of example. According to another embodiment (not illustrated) the preselected crystal channel direction may be the <11-23> lattice direction.

The substrate 700 is placed onto a substrate holder of an ion beam implantation apparatus. The ion beam implantation apparatus is adapted for ion implantation at different implant angles, wherein the ion beam changes the implant angle in an implant angle plane that runs orthogonal to the first substrate main surface 701. The ion beam has a default direction (idle ion beam axis). For ion beam implantation under changing implant angles, a deflection unit of the ion beam implantation apparatus deflects the ion beam with regard to the default orientation. The deflection is effective in an implant angle plane. In other words, for each implant angle, the ion beam axis and the target axis span the same plane.

Prior to ion implantation, the substrate 700 may be aligned to the implant angle plane and to the idle ion beam axis. Alternatively and/or additionally, the substrate 700 may be aligned to the implant angle plane and to the idle ion beam axis during or after ion implantation. Alignment to the implant angle plane includes a rotational movement ("twist"). Alignment to the idle ion beam axis includes tilting the substrate 700. The beam-tilt alignment may precede or may follow the rotational alignment.

Figure 1B:
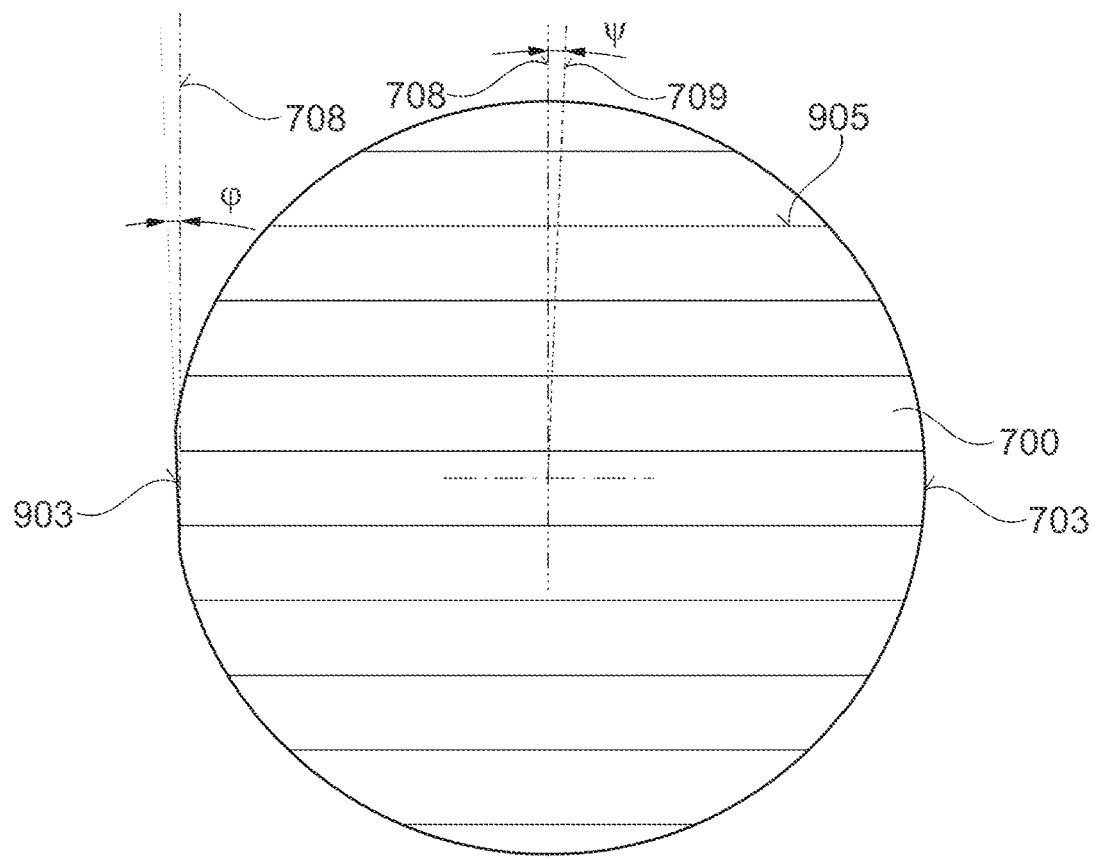

FIG. 1B shows a plan view of the substrate 700. The substrate 700 has an almost circular horizontal cross-section with a flat 903 forming a portion of the outer lateral surface 703. The flat 903 roughly indicates the orientation of a major crystal plane parallel to the c-axis, e.g., the (1-100) crystal plane or the (11-20) crystal plane. Alternatively, the substrate 700 may include a notch in the outer lateral surface, wherein the notch roughly indicates a major crystal direction. For example, an angular deviation φ between the flat 903 and the indicated major crystal plane may be in a range from −3 degrees to +3 degrees.

The rotational alignment brings the indicated major crystal plane in closer alignment with the implant angle plane. In other words, the rotational alignment brings a lateral major crystal direction 708 in the pertinent major crystal plane in closer alignment with a lateral target direction 709 in the implant angle plane.

For example, the rotational alignment may use an image recognition system analyzing the orientation of ribs 905 that result from the off-axis cut at the first substrate main surface 701. Alternatively or in addition, the rotational alignment may use data that may indicate the angular deviation between the orientation of the flat 903 and the indicated major crystal plane for each single substrate 700 individually.

Imperfections of the rotational alignment may result in a residual rotational misalignment ψ between the lateral major crystal direction 708 and the lateral target direction 709. The residual rotational misalignment ψ may be in a range from −0.2 degrees to +0.2 degrees.

FIGS. 1C-1F concern the beam-tilt alignment. In the ion beam implantation apparatus, the substrate 700 is oriented such that the preselected crystal channel direction 707 is as best as possible aligned to the target axis 706. The target axis 706 may be the default ion beam axis along which the dopant ions propagate in an idle mode providing ion implantation at a constant implant angle. The dopant ions are implanted (e.g., the dopant ions may be implanted after the rotational alignment and the beam-tilt alignment).

Figure 1C:
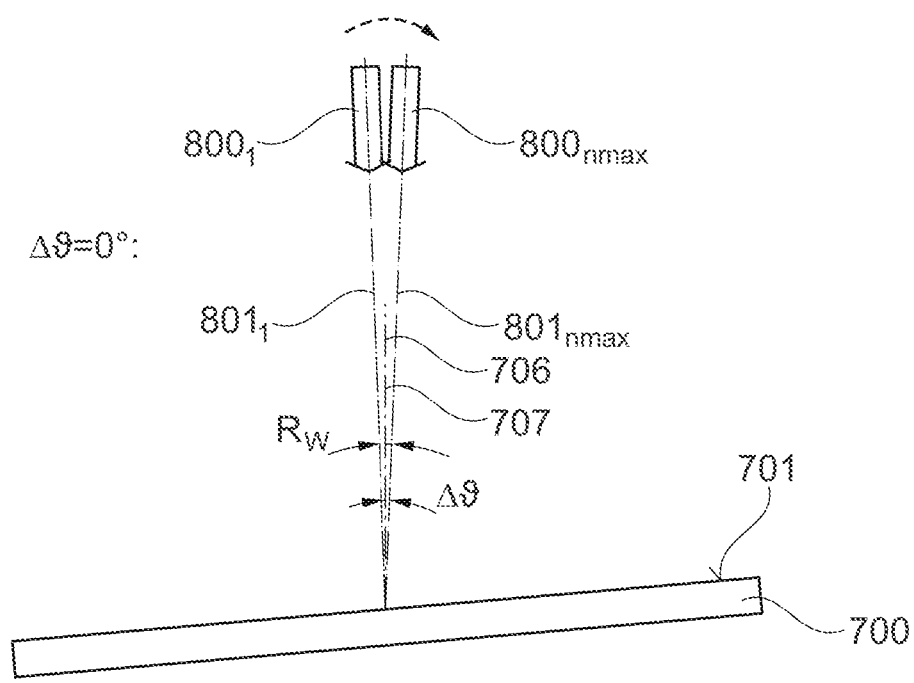

FIG. 1C shows the sweep of the ion beam axis 801 between a minimum value $801_1$ and a maximum value $801_{nmax}$ for the case that the preselected crystal channel direction 707 is perfectly aligned to the target axis 706. The residual angular misalignment Δθ is 0 degrees and the preselected crystal channel direction 707 is in the angular center of the implant angle range Rw.

For example, the implant may start at an implant angle closest to the channeling direction and may proceed to implant angles with greater angular distances to the channeling direction. In this way it may be possible to avoid or to keep low possible adverse impact of former implants on the channel acceptance width. According to an embodiment with symmetric implant angle range and with nmax being an odd number, the implant may start with an implant angle corresponding to the idle beam axis for (nmax+1)/2 and alternatingly proceeds to the two border value: (nmax+1)/2, (nmax+1)/2+1, (nmax+1)/2−1, (nmax+1)/2+2, (nmax+1)/2−2, . . . , nmax, 1.

Due to technical imperfections both with regards to the off-axis cut angle and with regard to the mechanism that orients the substrate 700 to the target axis 706, at the end of the beam-tilt alignment the preselected crystal channel direction 707 may typically not be perfectly aligned to the target axis 706.

Figure 1D:
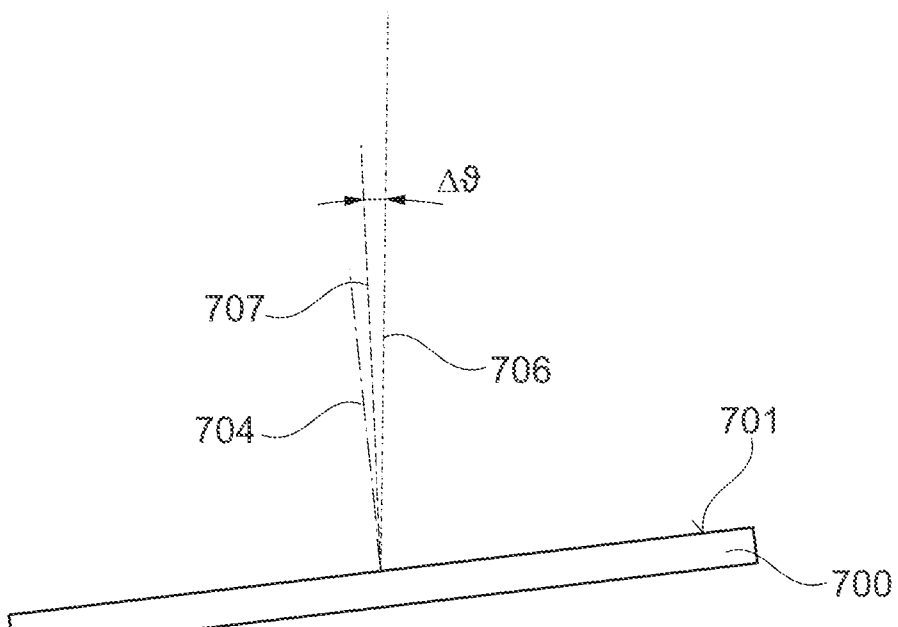

FIG. 1D shows the substrate 700 at the end of a beam-tilt alignment with a residual angular misalignment Δθ of about 2 degrees between the target axis 706 and the preselected crystal channel direction 707.

Figure 1E:
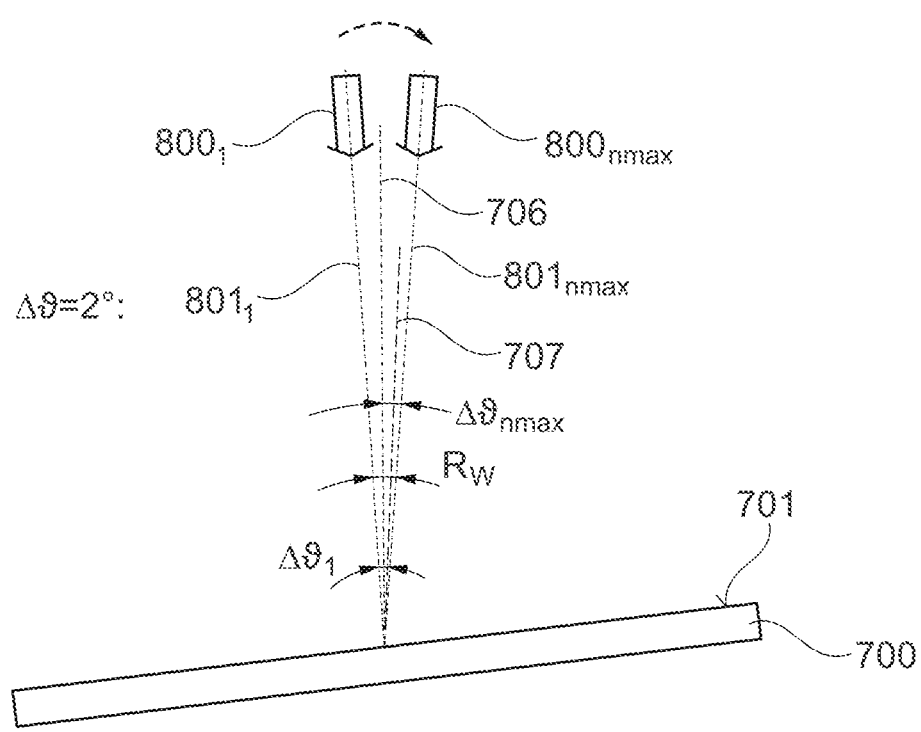

As illustrated in FIG. 1E, even with the residual angular misalignment Δθ of about 2 degrees, the preselected crystal channel direction 707 can still be within the implant angle range Rw. Provided that the half channel acceptance width is smaller than the angular distance between the preselected crystal channel direction 707 and the closer one of the boundary angles of the implant angle range Rw, the same (or approximately the same) amount of ion dopants is implanted through the channel as for the case illustrated in FIG. 1C.

Figure 1F:
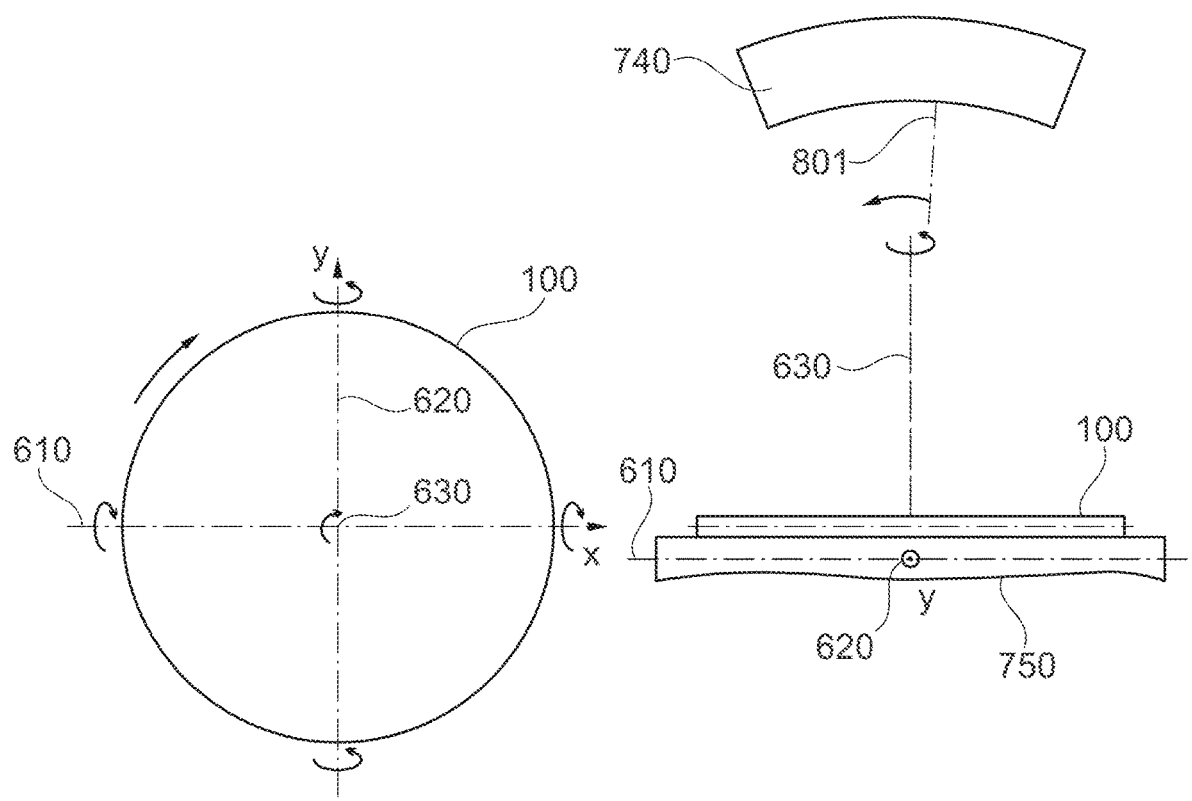

FIG. 1F schematically shows a substrate 100 placed in an ion beam implantation apparatus. The substrate 100 may be fixed on a substrate holder 750, e.g., by electrostatic force and/or by negative pressure. The substrate holder 750 may be adapted to perform a rotational movement about a first horizontal axis 610 of rotation. The substrate holder 750 may or may not be configured to perform a rotational movement about a second horizontal axis 620 of rotation. The second horizontal axis 620 of rotation and the first horizontal axis 610 of rotation may be perpendicular to each other. The first and second horizontal axes 610, 620 may be in the same horizontal plane or may have a vertical distance. In addition or alternatively, the substrate holder 750 may be adapted to perform a rotational movement (twist) about a vertical axis 630 of rotation. The vertical axis 630 of rotation may run through the lateral center point of the substrate 100.

The ion beam implantation apparatus may include an ion beam projection apparatus 740 adapted for variably deflecting an ion beam axis 801 at different angles within a first incident beam plane parallel to the first horizontal axis 610 of rotation. The ion beam projection apparatus 740 may or may not be adapted for variably deflecting the ion beam axis 801 at different angles within a second incident beam plane parallel to the second horizontal axis 620 of rotation.

Figure 2A:
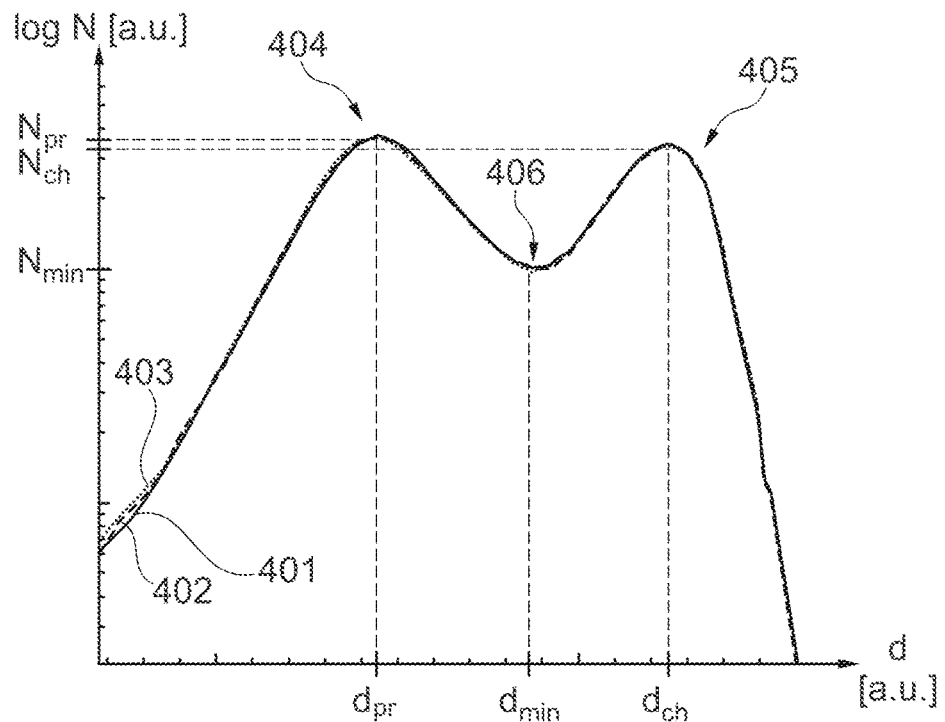
FIGS. 2A-2B are schematic diagrams showing vertical dopant profiles in semiconductor devices according to embodiments and illustrating effects of an ion beam implantation method according to an embodiment.
Figure 2B:
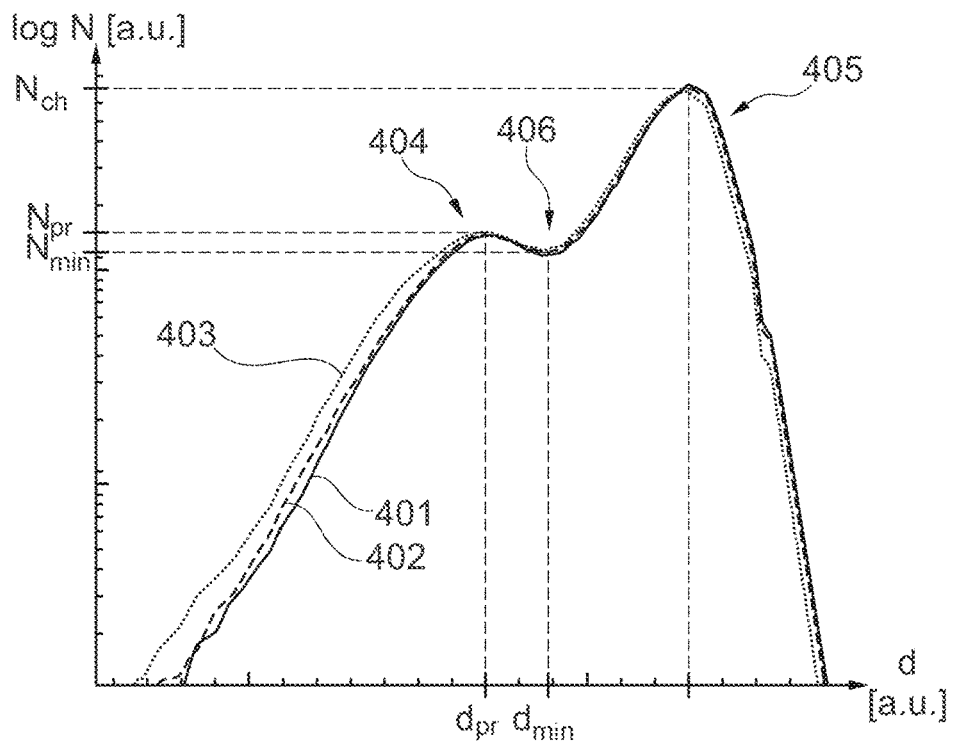

FIGS. 2A-2B show vertical dopant concentration profiles (in the following: vertical dopant profiles) that can be obtained in a silicon carbide substrate with hexagonal crystal lattice by using the ion beam implantation method as described with reference FIGS. 1A-1F. The vertical dopant profiles may correspond to portions of vertical dopant profiles of doped regions in the semiconductor body of a semiconductor device.

FIG. 2A shows the vertical dopant profiles of dopant ions, e.g., nitrogen ions, ion beam implanted at acceleration energy of 2.5 MeV and an implant angle sweep from −7 degrees to +7 degrees in steps of 1 degree symmetrically around the default ion beam direction. The preselected crystal channel direction is the c-axis of a 4H-SiC substrate. Line 401 represents the vertical dopant profile for an implant with the c-axis perfectly aligned to the target axis. Line 402 illustrates the resulting dopant profile in case the residual angular misalignment $\Delta\theta$ between the target axis and the c-axis is equal to 0.5 degrees. Line 403 illustrates the resulting dopant profile in case the residual angular misalignment $\Delta\theta$ between the target axis and the c-axis is equal to 1 degree. Reference sign 404 represents the end-of-range peak of the randomly implanted dopant ions (primary peak). Reference sign 405 indicates the end-of-range peak for the channeling dopant ions (channeling peak).

Position and maximum dopant concentration Nch of the channeling peak 405 show no or only few dependency from the residual angular misalignment $\Delta\theta$. In addition, the angular misalignment $\Delta\theta$ has only low impact on the rest of the dopant ion distribution. Thus the method may facilitate highly predictable and highly reproducible vertical dopant profiles for channeling dopant ions, wherein the method at the same time allows for alignment imperfections in the typical range for ion beam implantation apparatuses and for typical off-axis cut tolerances.

In order to predict the vertical dopant profile, it is sufficient to know that the residual angular misalignment between the target axis and the preselected crystal channel direction is within a certain range. Knowledge about the exact residual angular misalignment between the target axis and the selected crystal channel direction is not necessarily required to predict the vertical dopant profile with sufficient reliability (e.g., reliability exceeding a threshold reliability).

At the channeling peak 405, the vertical dopant profiles have a first local dopant concentration maximum Nch at a first distance dch to a first surface at a front side of a semiconductor body or to a first substrate main surface at the front side of a semiconductor substrate. At the primary peak 404 the vertical dopant profiles have a second local dopant concentration maximum Npr at a second distance dpr. Between the first distance dch and the second distance dpr, the vertical dopant profiles have a local dopant concentration minimum Nmin. The first distance dch is greater than the second distance dpr.

A difference between the first distance dch and the second distance dpr may be in a range from 400 nm to 550 nm. A ratio between the first local dopant concentration maximum Nch and the second local dopant concentration maximum Npr may be in a range from 0.9 to 1.1. A ratio between the sum of the first local dopant concentration maximum Nch and the second local dopant concentration maximum Npr on the one hand and the local dopant concentration minimum Nmin on the other hand may be in a range from 5 to 7.

In FIG. 2B the implant angle sweep ranges from −0.7 degrees to +0.7 degrees in steps of 0.1 degrees. The impact of an angular misalignment on position and maximum dopant concentration in the channeling peak 405 is still small. The primary peak 404 is significantly lower than in the example of FIG. 2A (e.g., the primary peak 404 of FIG. 2B may be lower than the primary peak 404 of FIG. 2A, and/or a difference between the primary peak 404 of FIG. 2B and the primary peak 404 of FIG. 2A may exceed a threshold difference). But both the channeling peak 405 and the primary peak 404 are independent from (and/or to a high degree independent from) the residual angular misalignment between the target axis and the preselected crystal channel direction.

With knowledge of the angular alignment precision of the ion implantation apparatus, the tolerance window for the off-axis cut angle α of the substrate and the width of the channel acceptance, the number of implants and the implant angle range may be selected to obtain a desired dopant distribution between the two end-of-range peaks 404, 405.

The vertical dopant profiles of FIGS. 2A and 2B benefit from the channeling effect. The implant method therefore allows the formation of doped regions with comparatively large vertical extension at comparatively low energy. For example, by implementing one or more of the techniques provided herein (e.g., one or more implantation techniques), doped regions may be formed having a larger vertical extension, as compared to forming doped regions without implementing one or more of the techniques provided herein. Alternatively and/or additionally, by implementing one or more of the techniques provided herein (e.g., one or more implantation techniques), doped regions with a vertical extension may be formed using lower energy, as compared to forming doped regions with the vertical extension without implementing one or more of the techniques provided herein. In combination with the end-of-range peak of the randomly implanted dopant ions, the method facilitates the approximation of plateau-like vertical dopant profiles, wherein in plateau-like dopant profiles the dopant concentration changes by a comparatively low amount across a comparatively large vertical range (e.g., the dopant concentration in a plateau-like dopant profile may change less than a threshold amount across a vertical range larger than a threshold).

Figure 2C:
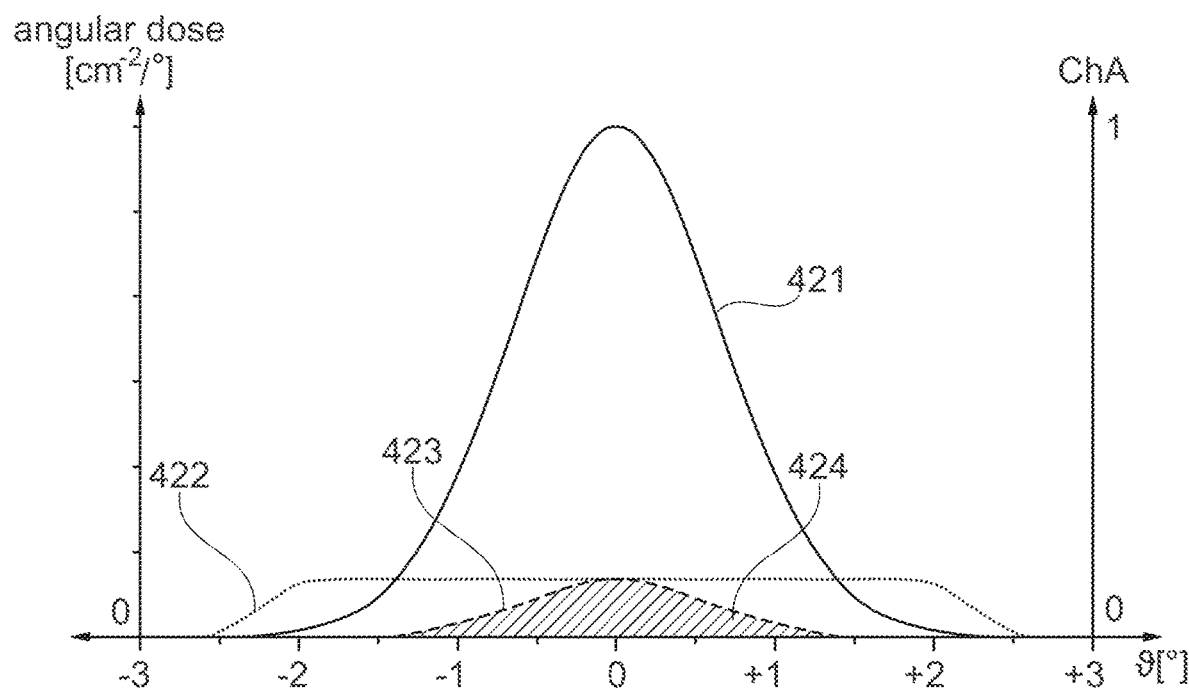
FIGS. 2C-2D are schematic diagrams for illustrating effects of an ion beam implantation method according to an embodiment.
Figure 2D:
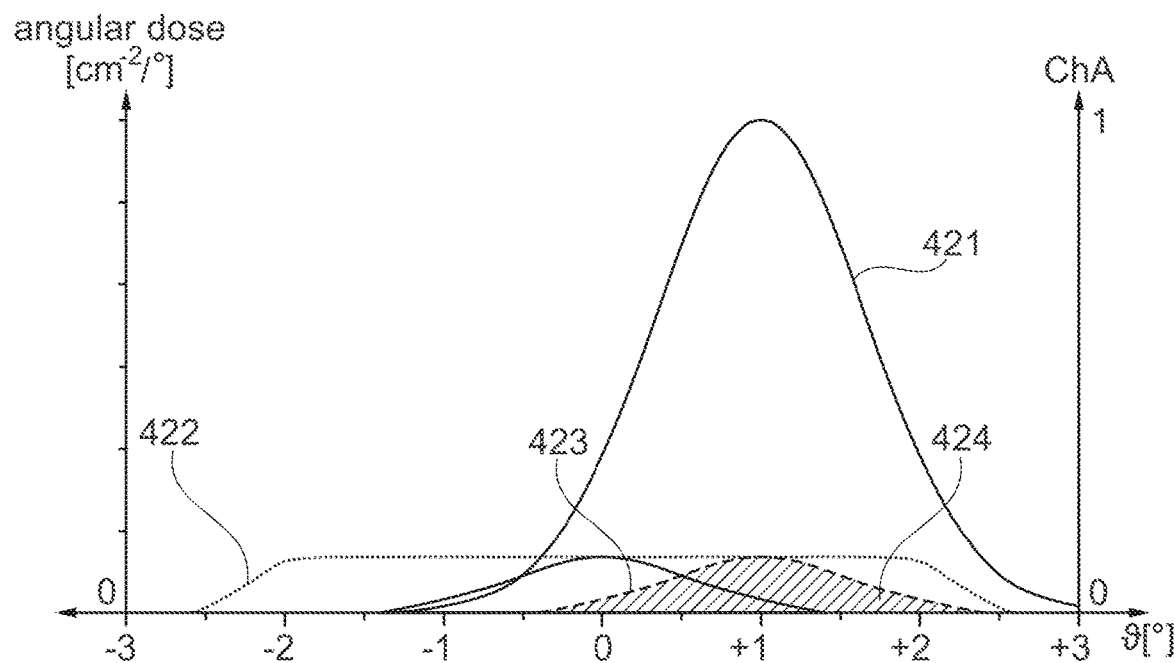

The diagrams of FIGS. 2C-2D illustrate further details with respect to the vertical dopant profiles 401, 402, 403 of FIG. 2A. For simplicity, the ion beam divergence is assumed as Gaussian-shaped and time-invariant. Likewise, the channel acceptance function 421 for channeling a specific dopant ion is approximated as time-invariant Gaussian distribution.

The channel acceptance function 421 may be obtained by simulation or by RBS (Rutherford Backscattering Spectrometry), by way of example.

In FIG. 2C the c-axis is precisely at 4 degrees and the first substrate main surface is tilted by exactly 4 degrees with respect to the default ion beam axis. The channeling direction (e.g., the c-axis) is perfectly aligned with the idle beam axis. A tilted implant includes 15 single shots, one of them at an implant angle parallel to the channeling direction and the others symmetric with respect to the channeling direction and at equal angular distances. The dotted line 422 depicts the summed profile with $1.5 \times 10^{13}$ centimeters $(cm)^{-2}$ integrated dose of 15 single shots separated by 0.3 degrees. Each single shot has an integrated dose of $1.0 \times 10^{12}$ $cm^{-2}$. The summed profile is constant from about −2 degrees to about +2 degrees. The summed profile is multiplied with the channel acceptance function 421 in angular space and results in a function illustrated by the dashed line 423. The resulting shaded area 424 below the dashed line 423 corresponds to the integrated dose in the channeling peak.

In FIG. 2D the incident default ion beam axis is misaligned to the channeling direction by 1 degree. In other words, the incident multi-shot center is still at 0 degrees but the c-axis is at 1 degree. The result of the multiplication of the summed profile (dotted line 422) with the channel acceptance function 421 in angular space and the resulting shaded area 424 corresponding to the integrated dose in the channeling peak are approximately the same as for FIG. 2C.

Figure 3:
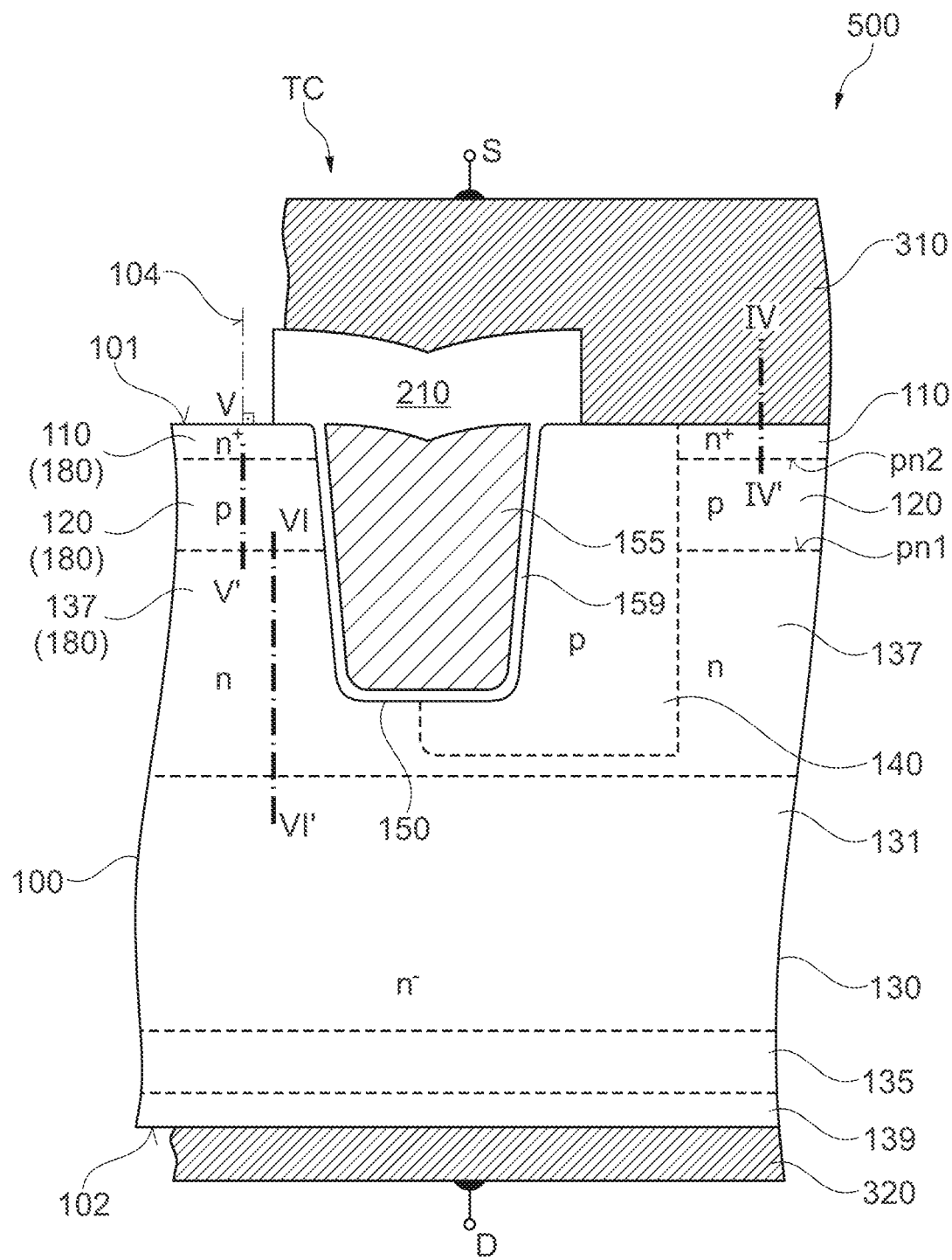
FIG. 3 illustrates a schematic vertical cross-sectional view of a portion of a semiconductor device with one or more doped regions including vertical dopant concentration profiles with channeling peak according to embodiments.

The semiconductor device 500 shown in FIG. 3 may be an IGBT (insulated gate bipolar transistor), an MCD (MOS controlled diode), or an IGFET (insulated gate field effect transistor), for example, an MOSFET (metal oxide semiconductor FET).

The semiconductor device 500 includes a semiconductor body 100 which may include a silicon carbide crystal with the main constituents silicon and carbon. The silicon carbide crystal may include impurities like hydrogen and oxygen and/or dopant atoms.

A first surface 101 at a front side of the semiconductor body 100 may be planar or ripped. A surface normal 104 orthogonal to a planar first surface 101 or orthogonal to a mean plane of a ripped first surface 101 defines a vertical direction. Directions orthogonal to the surface normal 104 are horizontal and lateral directions. A second surface 102 at the semiconductor body rear side may extend parallel to the first surface 101.

The semiconductor device 500 may include a transistor cell TC with a gate structure 150 that extends from the first surface 101 into the semiconductor body 100. The gate structure 150 includes a gate dielectric 159 and a conductive gate electrode 155. The gate electrode 155 is electrically separated from the semiconductor body 100. For example, the gate dielectric 159 may completely separate the gate electrode 155 and the semiconductor body 100.

The transistor cell TC further includes a source region 110, a body region 120, and a shielding region 140. The source region 110 and the body region 120 adjoin (e.g., directly adjoin) a first sidewall of the gate structure 150. The source region 110 is between the body region 120 and the first surface 101. The body region 120 separates the source region 110 from a drift structure 130.

The drift structure 130 is formed between the body region 120 and the second surface 102. The body region 120 and the drift structure 130 form a first pn junction pn1. The body region 120 and the source region 110 form a second pn junction pn2.

The shielding region 140 may extend along a second sidewall of the gate structure 150. A dopant concentration in the shielding region 140 along the second sidewall may be higher, e.g., at least ten times higher than a dopant concentration in the body region 120 along the first sidewall. A vertical extension of the shielding region 140 may be greater than a vertical extension of the gate structure 150. For example, a local dopant concentration maximum in the shielding region 140 may have a greater distance to the first surface 101 than a bottom of the gate structures 150.

The drift structure 130 includes a voltage sustaining layer. For example, the voltage sustaining layer may include a drift zone 131. Vertical extension and dopant concentration in the drift zone 131 are selected such that the semiconductor device 500 reaches its nominal blocking voltage capability. The drift zone 131 may be formed in a layer grown by epitaxy. A mean net dopant concentration in the drift zone 131 may be in the range from $1.0 \times 10^{15}$ $cm^{-3}$ to $5.0 \times 10^{16}$ $cm^{-3}$. A vertical extension of the drift zone 131 is related to the nominal blocking capability of the semiconductor device 500. The vertical extension of the drift zone 131 may be in the range of about 1 μm to several 10 μm.

The drift structure 130 further includes a heavily doped contact layer 139 adjoining (e.g., directly adjoining) the second surface 102. The heavily doped contact layer 139 is in contact with a rear side metallization 320 that adjoins (e.g., directly adjoins) the second surface 102. Along the second surface 102, a dopant concentration in the contact layer 139 is sufficiently high (e.g., higher than a threshold dopant concentration) such that the contact layer 139 and the rear side metallization 320 form a low-resistive ohmic contact. In case the semiconductor device 500 is or includes an MCD or an IGFET, the contact layer 139 has the same conductivity type as the drift zone 131. In case the semiconductor device 500 is an IGBT, the contact layer 139 has the complementary conductivity type of the drift zone 131 or includes zones of both conductivity types.

The drift zone 131 may adjoin (e.g., directly adjoin) the contact layer 139 or a field stop or buffer zone 135 may be formed between the drift zone 131 and the contact layer 139. The field stop or buffer zone 135 forms a unipolar junction with the drift zone 131. A vertical extension of the field stop of buffer zone 135 may be approximately in a range from 1 μm to 10 μm. A mean dopant concentration in the field stop or buffer zone 135 may be in a range from $1.0 \times 10^{17}$ $cm^{-3}$ to $1.0 \times 10^{18}$ $cm^{-3}$, by way of example. The field stop of buffer zone 135 may relax mechanical stress in the semiconductor body 100 and/or may contribute to shaping the electric field in the drift structure 130.

The drift structure 130 may include further doped regions, for example barrier zones and/or current spread regions 137 of the conductivity type of the drift zone 131 or counter-doped regions. Each current spread region 137 may adjoin (e.g., directly adjoin) a body region 120 and may extend between neighboring shielding regions 140. A mean net dopant concentration in the current spread regions 137 is higher than in the drift zone 131.

A front side electrode 310 is electrically connected to the source region 110, the body region 120, and the shielding region 140. An interlayer dielectric 210 electrically separates the front side electrode 310 and the gate electrode 155.

According to an embodiment, the transistor cells TC are n-channel FET cells with p-doped body regions 120, n-doped source regions 110 and n-doped drift zone 131. According to another embodiment, the transistor cells TC are p-channel FET cells with n-doped body regions 120, p-doped source regions 110 and p-doped drift zone 131.

The source region 110, the body region 120, the current spread region 140, the shielding region 140, the contact layer 139 and/or the field stop or buffer zone 135 may be formed using an ion beam implantation method with varying implant angles and channeling dopant ions as described above, e.g., with reference to FIGS. 1A to 1F. For example, the semiconductor device 500 may include one, two or more of the vertical doping profiles as described with reference to FIG. 4A-4C, FIG. 5, FIG. 6 and FIG. 7. The method applies also to further layouts and designs for the transistor cell TC, e.g., to transistor cells with double-sided channel.

Figure 4A:
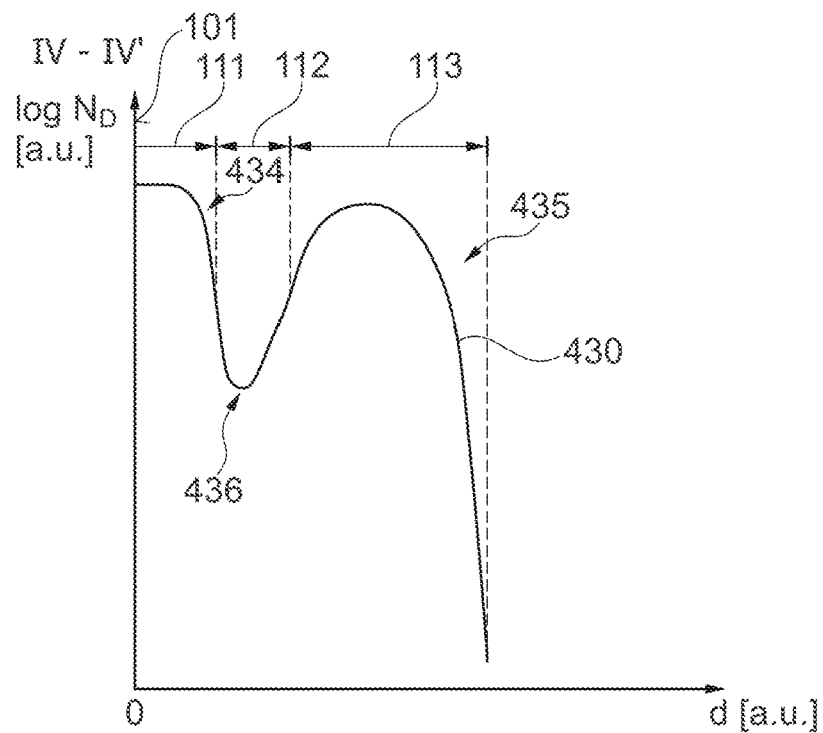
FIGS. 4A-4C are schematic diagrams illustrating vertical doping profiles along line IV-IV' of the semiconductor device illustrated in FIG. 3.

FIG. 4A shows a possible vertical source doping profile 430 of the source region 110 of FIG. 3. The vertical source doping profile 430 shows the dopant concentration ND as a function of a distance d to the first surface 101. The vertical source doping profile may include a primary peak 434 in a first source-sub region 111, a local doping concentration minimum 436 or valley in a second source sub-region 112 and a channeling peak 435 in a third source sub-region 113. The doping concentration value at the local doping concentration minimum 436 may be adjusted with respect to a desired total bulk resistance of the source region 110, by way of example.

Figure 4B:
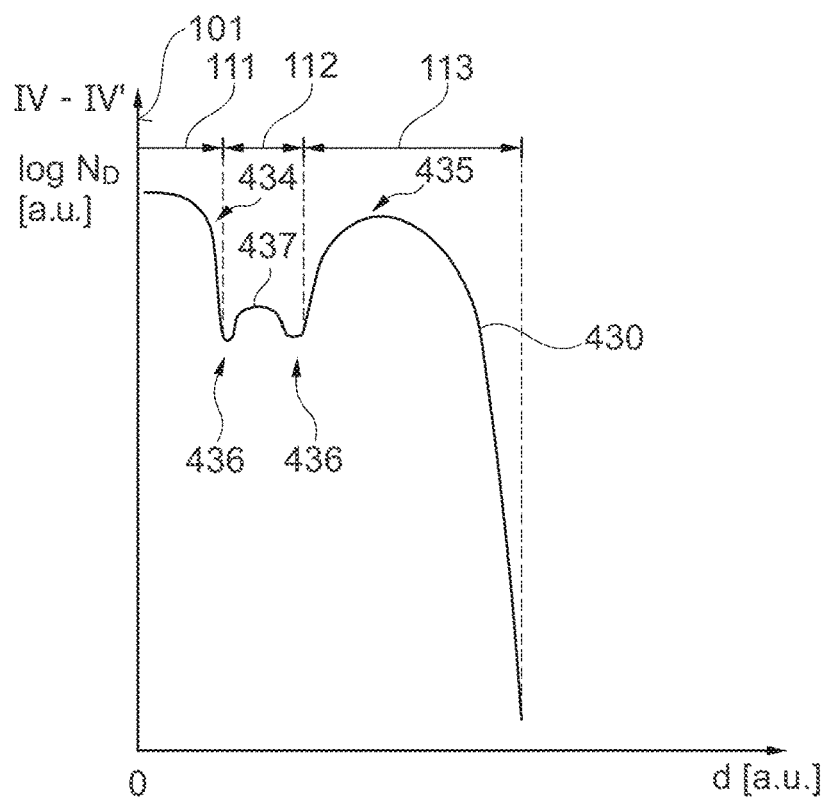

FIG. 4B refers to second source sub-regions 112 with more than one local doping concentration minimum 436. In the example illustrated in FIG. 4B, the second source sub-region 112 includes two local doping concentration minima 436 and one local doping concentration maximum 437. The number of doping minima and doping maxima may also be greater than illustrated in FIG. 4B.

Figure 4C:
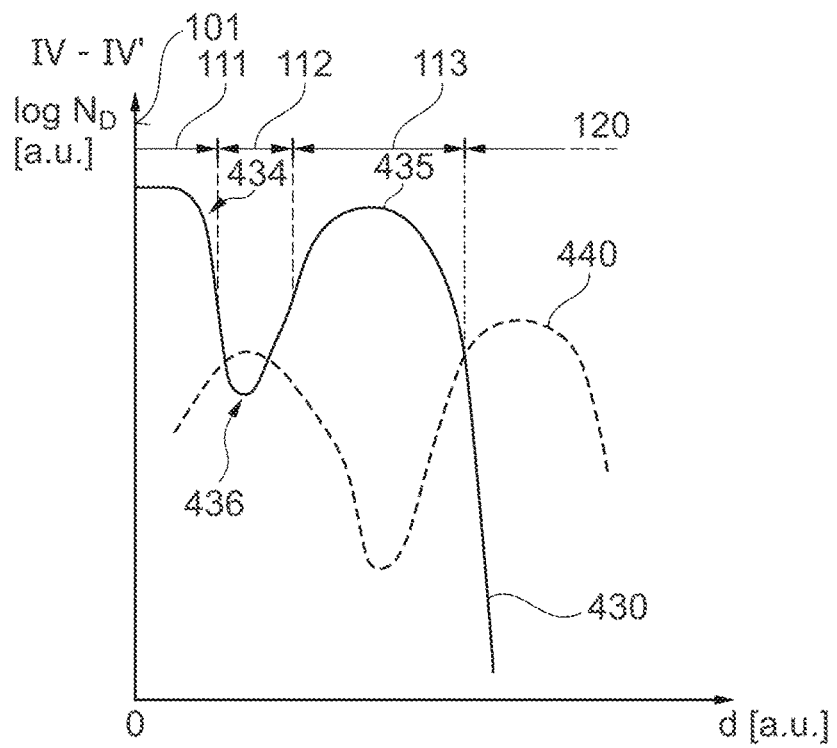

In FIG. 4C the doping in the source region 110 includes an n-type component and a p-type component. The n-type component may have a vertical source dopant profile 440 similar to that one illustrated in FIG. 4A. The p-type component may also include a channeling peak and a primary peak. The p-type primary peak may be formed between the n-type primary peak and the n-type channeling peak and may be used to tune the effective ohmic resistance of the source region between the first surface 110 and the body region 120. The p-type channeling peak may form a portion of the body region 120 and may define the pn junction between the third source sub-region 113 and the body region 120.

Figure 5:
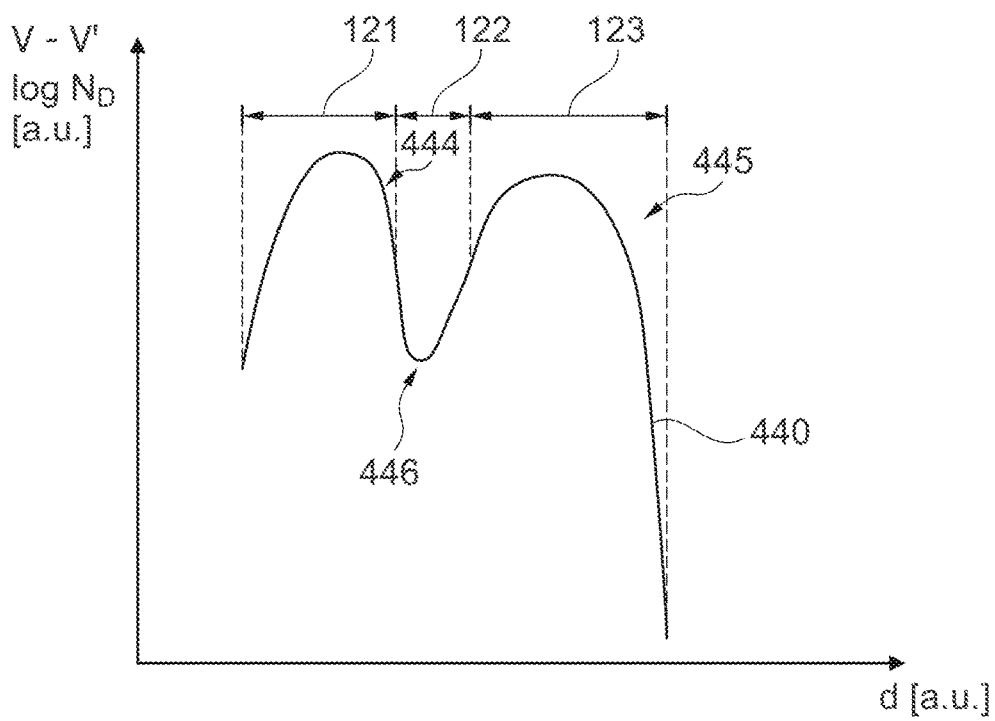
FIG. 5 is a schematic diagram illustrating a vertical doping profile along line V-V' of the semiconductor device illustrated in FIG. 3.

FIG. 5 shows a possible vertical body doping profile 440 of the body region 120 of FIG. 3. The vertical body doping profile 440 shows the dopant concentration ND in the body region 120 of FIG. 3 as a function of the distance d to the first surface 101. The vertical body doping profile 440 may include a primary peak 444 in a first body sub-region 121, a local doping concentration minimum 446 or valley in a second body sub-region 122 and a channeling peak 445 in a third body sub-region 123.

Figure 6:
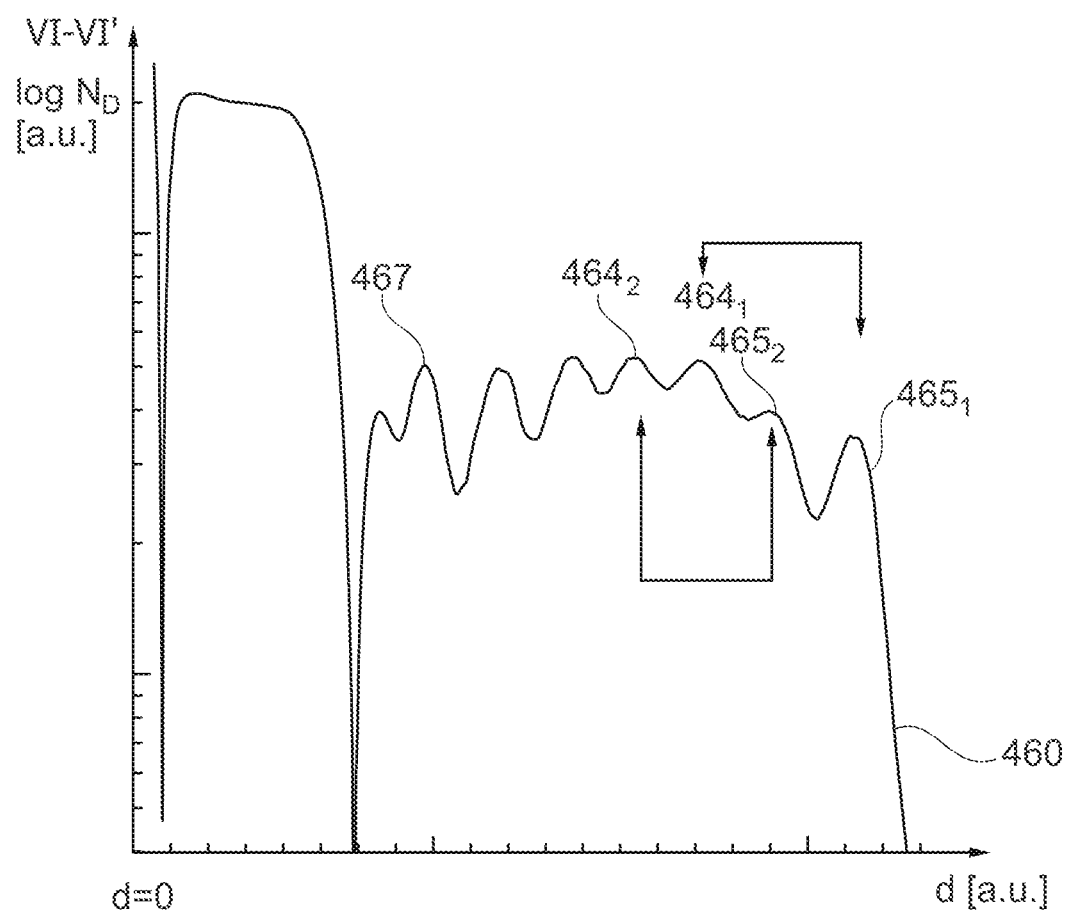
FIG. 6 is a schematic diagram showing a vertical dopant profile according to an embodiment including multiple ion implantation processes.

In FIG. 6 a vertical current spread doping profile 460 shows a dopant concentration ND in the current spread region 137 of FIG. 3 as a function of the distance d to the first surface 101. The vertical current spread doping profile 460 may include a first pair of one primary peak $464_1$ and one channeling peak $465_1$ resulting from an ion beam implantation with an acceleration energy of 2.5 MeV. The vertical current spread doping profile 460 may include a second pair of one primary peak $464_2$ and one channeling peak $465_2$ resulting from an ion beam implantation with an acceleration energy of 2.1 MeV. The channeling peak and the primary peak of each pair have a specific distance to each other. The vertical current spread doping profile 460 may include further peaks 467 resulting from further implants that may or that may not use channeling.

In FIG. 7 another vertical doping profile 470 shows the dopant concentration ND in a doped region as a function of a distance d to one of the main surfaces of a semiconductor body. The vertical doping profile 470 may be a vertical current spread doping profile of the semiconductor device 500 shown in FIG. 3, wherein d indicates the distance to the first surface 101 at the front side. Alternatively, the vertical doping profile 470 may be the vertical doping profile in the p doped columns or in the n doped columns of a superjunction structure.

The doped region includes a first local dopant concentration maximum at a first distance $dch_1$ to the first surface (d=0), a second local dopant concentration maximum at a second distance $dpr_1$ to the first surface, and at least one local dopant concentration minimum between the first distance $dch_1$ and the second distance $dpr_1$. Starting from the first distance $dch_1$, the dopant concentration in the doped region decreases with increasing distance to the first surface by 90% of the first local dopant concentration maximum within a first distance d1. For example, the semiconductor body includes or consists of 4H-SiC and the first distance d1 is at most 2 µm.

FIG. 7 further shows a vertical reference doping profile 450 formed without using the channeling effect. Compared to the vertical reference doping profile 450, the vertical body doping profile 470 shows a steeper trailing slope at the side opposite to the first surface. Using the possibility to define two peaks with one ion implantation process that uses varying implant angles, the vertical doping profile 470 may be formed by a lower number of ion beam implants than the vertical reference doping profile 450.

The doping profile 470 may include at least two primary peaks $474_1$, $474_2$ and two channeling peaks $475_1$, $475_2$. A first peak pair with one primary peak $474_1$ and one channeling peak $475_1$ results from an ion beam implantation with a first acceleration voltage. A second peak pair of another primary peak $474_2$ and another channeling peak $475_2$ results from an ion beam implantation with a second, lower acceleration voltage. The channeling peak $475_2$ of the second peak pair may be between the primary peak $474_1$ and the channeling peak $475_1$ of the first peak pair. The channeling peak and the primary peak of each peak pair have a specific distance to each other. The vertical body doping profile may include further peaks 477 resulting from further implants that may or that may not use channeling.

Another ion beam implantation method may include orienting a substrate to a lateral target direction of an ion beam implantation apparatus, wherein a residual angular misalignment between the lateral target direction and the lateral major crystal direction is within a lateral angular tolerance interval. The method may further include implanting dopant ions into the substrate using an ion beam propagating in an incident beam plane parallel to an ion beam axis, e.g., spanned by the ion beam axis and a substrate normal, wherein the dopant ions are implanted at different twist angles between the incident beam plane and the lateral target direction as described above. The different twist angles are within a twist angle range (total rotational sweep range). The twist angle range may be greater than the lateral angular tolerance interval, for example at least twice or at least three times the angular tolerance interval. The twist angle range may be smaller than ten times the lateral angular tolerance interval, for example at most five times or at most three times the angular tolerance interval. The lateral major crystal direction may be a horizontal major crystal direction or may be an orthogonal projection of any major crystal direction into the horizontal plane. The lateral target direction may be an orthogonal projection of a target direction as described above into the horizontal plane.

The ion beam propagates along an ion beam axis as described above. The incident beam plane may be spanned by the ion beam axis and a vertical direction as described above. For example, with the lateral target direction at 0 degrees, the total rotational sweep range for the implant positions may be in a range from −14 degrees to +14 degrees, from −4.9 degrees to +4.9 degrees, from −2.1 degrees to +2.1 degrees, from −1.4 degrees to +1.4 degrees, or from −0.7 degrees to +0.7 degrees, by way of example.

The lateral angular tolerance interval between the lateral target direction and the lateral major crystal axis may be at most 3 degrees, e.g., at most 1.6 degrees, at most 1 degrees, at most 0.5 degrees, at most 0.2 degrees or at most 0.1 degrees. The total rotational sweep range for the implant positions may be at most 10 times, e.g., at most 5 times the lateral angular tolerance interval.

What is claimed is:

1. An ion beam implantation method, comprising:
   orienting a substrate to a target axis, wherein a residual angular misalignment exists between the target axis and a preselected crystal channel direction in the substrate and is within an angular tolerance interval, wherein a channel acceptance width is effective for the preselected crystal channel direction;
   determining an implant angle range, for dopant ion implantation, that is greater than 80%, and smaller than 500%, of a sum of (i) the channel acceptance width and (ii) twofold the angular tolerance interval that the residual angular misalignment is within; and
   implanting, at implant angles within the implant angle range and through a first substrate main surface of the substrate, dopant ions into the substrate using an ion beam propagating along an ion beam axis, wherein:
      the implant angles are between the ion beam axis and the target axis; and
      the ion beam impinges in a same sub-region of the first substrate main surface for the implant angles at which the dopant ions are implanted.

2. The method according to claim 1, wherein:
the ion beam continuously sweeps the implant angle range at least once to implant the dopant ions into the substrate.

3. The method according to claim 1, wherein:
implanting the dopant ions comprises performing nmax implant sub-processes at nmax different implant angles;
the implant angles comprise the nmax different implant angles; and
nmax is at least 2.

4. The method according to claim 3, wherein:
the nmax different implant angles are equally spaced.

5. The method according to claim 3, wherein:
the nmax implant sub-processes comprise one or more implant sub-process pairs; and
implant angles of an implant sub-process pair of the one or more implant sub-process pairs are symmetric with respect to the target axis.

6. The method according to claim 3, wherein:
at least one of the nmax different implant angles deviates by at most 0.3 degrees from 0 degrees.

7. The method according to claim 3, wherein:
neighboring implant angles of the nmax different implant angles differ from each other by at most 0.5 degrees.

8. The method according to claim 1, wherein:
the implant angle range is at most 6 degrees.

9. The method according to claim 1, comprising:
determining an angular deviation between a lateral target direction and a lateral major crystal direction in the substrate; and
prior to implanting the dopant ions, aligning the lateral major crystal direction to the lateral target direction based upon the angular deviation.

10. An ion beam implantation method, comprising: orienting a substrate to a target axis, wherein a residual angular misalignment exists between the target axis and a preselected crystal channel direction in the substrate and is within an angular tolerance interval, wherein a channel acceptance width is effective for the preselected crystal channel direction; determining an implant angle range, for dopant ion implantation, that is greater than 80%, and smaller than 500%, of a sum of (i) the channel acceptance width and (ii) twofold the angular tolerance interval that the residual angular misalignment is within; aligning a lateral major crystal direction in the substrate based upon an angular deviation; and implanting, at implant angles within the implant angle range and through a first substrate main surface of the substrate, dopant ions into the substrate using an ion beam propagating along an ion beam axis, wherein: the implant angles are between the ion beam axis and the target axis; and the ion beam impinges in a same sub-region of the first substrate main surface for the implant angles at which the dopant ions are implanted.

11. The method according to claim 10, wherein: the ion beam continuously sweeps the implant angle range at least once to implant the dopant ions into the substrate.

12. The method according to claim 10, wherein: implanting the dopant ions comprises performing nmax implant sub-processes at nmax different implant angles; the implant angles comprise the nmax different implant angles; and nmax is at least 2.

13. The method according to claim 12, wherein: the nmax different implant angles are equally spaced.

14. The method according to claim 12, wherein: the nmax implant sub-processes comprise one or more implant sub-process pairs; and implant angles of an implant sub-process pair of the one or more implant sub-process pairs are symmetric with respect to the target axis.

15. The method according to claim 12, wherein: at least one of the nmax different implant angles deviates by at most 0.3 degrees from 0 degrees.

16. An ion beam implantation method, comprising: orienting a substrate to a target axis, wherein a residual angular misalignment exists between the target axis and a preselected crystal channel direction in the substrate and is within an angular tolerance interval, wherein a channel acceptance width is effective for the preselected crystal channel direction; determining an implant angle range, for dopant ion implantation, that is greater than 80%, and smaller than 500%, of a sum of (i) the channel acceptance width and (ii) twofold the angular tolerance interval that the residual angular misalignment is within; aligning a lateral major crystal direction in the substrate; and implanting, at implant angles within the implant angle range and through a first substrate main surface of the substrate, dopant ions into the substrate using an ion beam propagating along an ion beam axis, wherein: the implant angles are between the ion beam axis and the target axis; and the ion beam impinges in a same sub-region of the first substrate main surface for the implant angles at which the dopant ions are implanted.

17. The method according to claim 16, wherein: the ion beam continuously sweeps the implant angle range at least once to implant the dopant ions into the substrate.

18. The method according to claim 16, wherein: implanting the dopant ions comprises performing nmax implant sub-processes at nmax different implant angles; the implant angles comprise the nmax different implant angles; and nmax is at least 2.

19. The method according to claim 18, wherein: the nmax different implant angles are equally spaced.

20. The method according to claim 18, wherein: the nmax implant sub-processes comprise one or more implant sub-process pairs; and implant angles of an implant sub-process pair of the one or more implant sub-process pairs are symmetric with respect to the target axis.eam axis and the target axis; and the ion beam impinges in a same sub-region of the first substrate main surface for the implant angles at which the dopant ions are implanted.

* * * * *